US012080763B2

(12) United States Patent
Dasgupta et al.

(10) Patent No.: US 12,080,763 B2
(45) Date of Patent: *Sep. 3, 2024

(54) SILICIDE FOR GROUP III-NITRIDE DEVICES AND METHODS OF FABRICATION

(71) Applicant: Intel Corporation, Santa Clara, CA (US)

(72) Inventors: Sansaptak Dasgupta, Hillsboro, OR (US); Marko Radosavljevic, Portland, OR (US); Han Wui Then, Portland, OR (US); Paul Fischer, Portland, OR (US); Walid Hafez, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/826,058

(22) Filed: May 26, 2022

(65) Prior Publication Data

US 2022/0293738 A1 Sep. 15, 2022

Related U.S. Application Data

(63) Continuation of application No. 16/144,946, filed on Sep. 27, 2018, now Pat. No. 11,387,327.

(51) Int. Cl.
*H01L 29/20* (2006.01)
*H01L 21/033* (2006.01)
(Continued)

(52) U.S. Cl.
CPC ...... *H01L 29/2003* (2013.01); *H01L 21/0337* (2013.01); *H01L 21/28575* (2013.01);
(Continued)

(58) Field of Classification Search
CPC ............ H01L 29/2003; H01L 21/0337; H01L 21/28575; H01L 21/3212; H01L 21/76802;
(Continued)

(56) References Cited

U.S. PATENT DOCUMENTS 11,387,237 B2 * 7/2022 Ching ............... H01L 21/76831
2005/0023555 A1 * 2/2005 Yoshida .............. H01L 29/7789
257/E29.253

(Continued)

OTHER PUBLICATIONS

Notice of Allowance from U.S. Appl. No. 16/144,946 notified Mar. 9, 2022, 8 pgs.
(Continued)

*Primary Examiner* — Robert G Bachner
(74) *Attorney, Agent, or Firm* — Essential Patents Group, LLP

(57) ABSTRACT

A transistor includes a polarization layer above a channel layer including a first III-Nitride (III-N) material, a gate electrode above the polarization layer, a source structure and a drain structure on opposite sides of the gate electrode, where the source structure and a drain structure each include a second III-N material. The transistor further includes a silicide on at least a portion of the source structure or the drain structure. A contact is coupled through the silicide to the source or drain structure.

20 Claims, 20 Drawing Sheets

(51) Int. Cl.
  *H01L 21/285* (2006.01)
  *H01L 21/321* (2006.01)
  *H01L 21/768* (2006.01)
  *H01L 29/49* (2006.01)
  *H01L 29/51* (2006.01)
  *H01L 29/778* (2006.01)
(52) U.S. Cl.
  CPC .... *H01L 21/3212* (2013.01); *H01L 21/76802* (2013.01); *H01L 29/4966* (2013.01); *H01L 29/517* (2013.01); *H01L 29/778* (2013.01)
(58) Field of Classification Search
  CPC .. H01L 29/4966; H01L 29/517; H01L 29/778
  See application file for complete search history.

(56) References Cited

U.S. PATENT DOCUMENTS

| | | | | |
|---|---|---|---|---|
| 2012/0306045 | A1* | 12/2012 | Ruth | H01L 21/31053 257/E21.546 |
| 2014/0349449 | A1* | 11/2014 | Basu | H01L 29/475 438/172 |
| 2021/0167200 | A1 | 6/2021 | Radosavljevic et al. | |

OTHER PUBLICATIONS

Restriction Requirement from U.S. Appl. No. 16/144,946 notified Nov. 17, 2021, 6 pgs.

\* cited by examiner

SILICIDE FOR GROUP III-NITRIDE DEVICES AND METHODS OF FABRICATION

CLAIM OF PRIORITY

This application is a continuation of, and claims the benefit of priority to, U.S. patent application Ser. No. 16/144,946, filed on Sep. 27, 2018 and titled "SILICIDE FOR GROUP III-NITRIDE DEVICES AND METHODS OF FABRICATION," which is incorporated by reference in its entirety for all purposes.

BACKGROUND

In the fields of wireless communication and power management, various components can be implemented using solid-state devices. For example, in radio frequency (RF) communication, the RF front-end is a generic term for the circuitry between an antenna and a digital baseband system. Such RF front-end components may include one or more diodes in conjunction with one or more transistors, such as one or more field-effect transistors (FETs). Due, in part, to their large bandgap and high mobility, gallium nitride (GaN) and other group III-Nitride (III-N) materials are suitable for integrated circuit applications needing high-frequency and/or high-power FETs. However, transistor functionality may be susceptible to resistive elements in the transistor structure. For example, resistance between metallization structures and source or drain regions of transistors may impair flow of current from transistor to other circuit elements connected with the transistor. Reducing such resistance is important as transistors are scaled in physical dimensions.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Also, various physical features may be represented in their simplified "ideal" forms and geometries for clarity of discussion, but it is nevertheless to be understood that practical implementations may only approximate the illustrated ideals. For example, smooth surfaces and square intersections may be drawn in disregard of finite roughness, corner-rounding, and imperfect angular intersections characteristic of structures formed by nanofabrication techniques. Further, where considered appropriate, reference labels have been repeated among the figures to indicate corresponding or analogous elements.

DESCRIPTION OF THE EMBODIMENTS

Figure 1A:
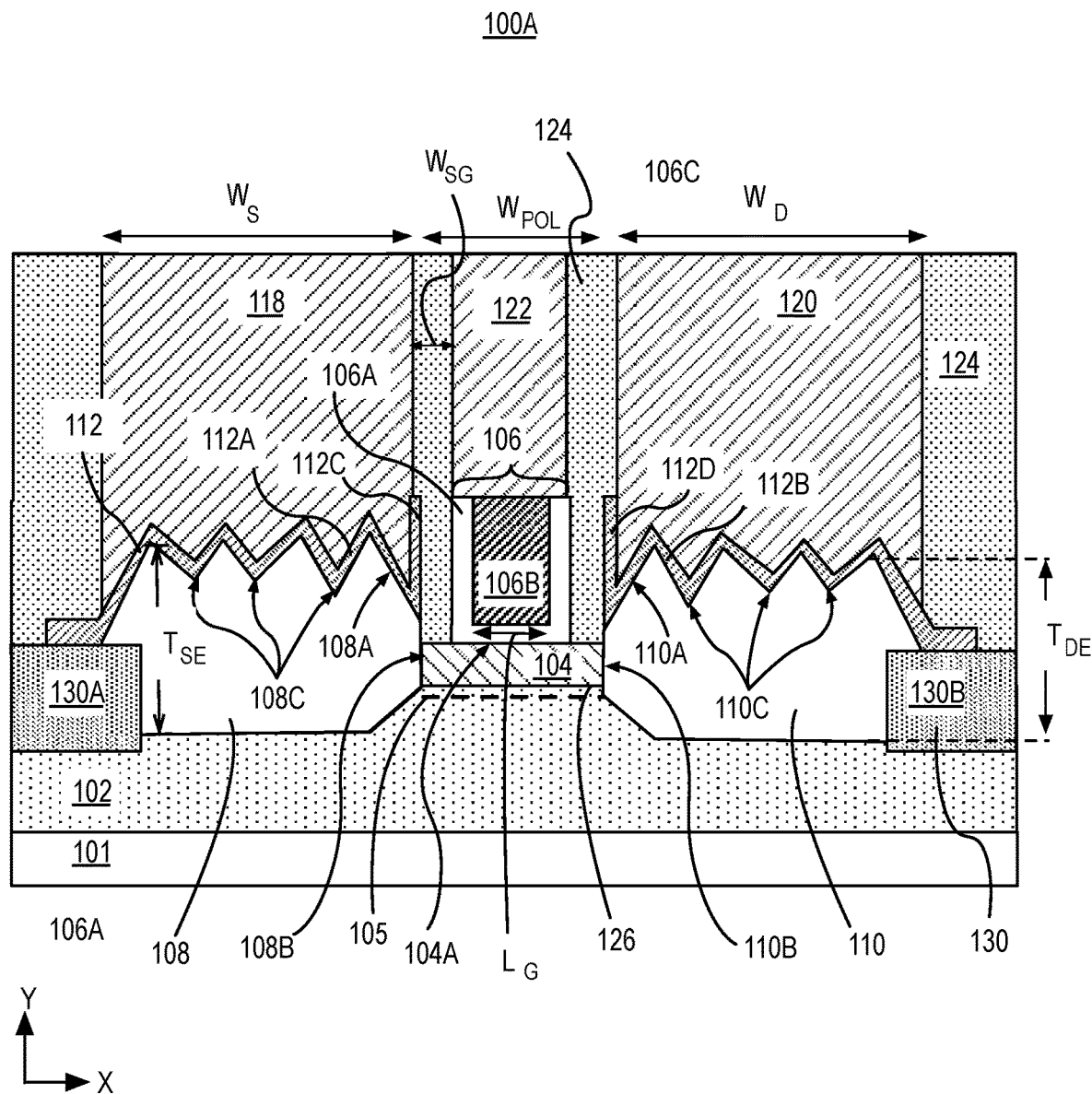
FIG. 1A illustrates a cross-sectional view of a III-N transistor having a silicide on the source and drain structures, in accordance with embodiments of the present disclosure.

III-N devices with silicide metal contacts are described herein. In the following description, numerous specific details are set forth, such as structural schemes and detailed fabrication methods in order to provide a thorough understanding of embodiments of the present disclosure. It will be apparent to one skilled in the art that embodiments of the present disclosure may be practiced without these specific details. In other instances, well-known features, such as transistor operations and switching operations associated with embedded memory, are described in lesser detail in order to not unnecessarily obscure embodiments of the present disclosure. Furthermore, it is to be understood that the various embodiments shown in the figures are illustrative representations and are not necessarily drawn to scale.

Certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

In the following description, numerous details are set forth. However, it will be apparent to one skilled in the art, that the present disclosure may be practiced without these specific details. In some instances, well-known methods and devices are shown in block diagram form, rather than in detail, to avoid obscuring the present disclosure. Reference throughout this specification to "an embodiment" or "one embodiment" or "some embodiments" means that a particular feature, structure, function, or characteristic described in connection with the embodiment is included in at least one embodiment of the disclosure. Thus, the appearances of the phrase "in an embodiment" or "in one embodiment" or "some embodiments" in various places throughout this specification are not necessarily referring to the same embodiment of the disclosure. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example, in the context of materials, one material or material disposed over or under another may be directly in contact or may have one or more intervening materials. Moreover, one material disposed between two materials may be directly in contact with the two layers or may have one or more intervening layers. In contrast, a first material "on" a second material is in direct contact with that second material/material. Similar distinctions are to be made in the context of component assemblies.

As used throughout this description, and in the claims, a list of items joined by the term "at least one of" or "one or more of" can mean any combination of the listed terms. Unless otherwise specified in the explicit context of their use, the terms "substantially equal," "about equal" and "approximately equal" mean that there is no more than incidental variation between two things so described. In the art, such variation is typically no more than +/−10% of a predetermined target value.

In the fields of wireless communication and power management, optimizing power efficiency of RF-front end components and minimizing energy loss during operation is highly desirable. Devices such as transistors fashioned from III-N materials, may be susceptible to energy loss from various sources, such as conduction and switching losses. The latter is affected by the transition between "on" and "off" states during device operation. In particular, transitioning between on and off states of the transistor may be affected by resistances within the transistor structure. Such resistances include internal resistances associated with carrier mobility within the channel material, and external resistances between epitaxially grown source and drain structures, and external contacts associated with source and drain resistances and metal-semiconductor junction resistances. While III-N channels generally have high carrier mobility, to fully capitalize on this attribute resistance along current paths should be minimized. Thus, transistor architectures that minimize contact resistance are especially attractive for practical realization of devices based on III-N materials.

In some embodiments of the present disclosure, a silicide is between a source contact and a source structure or between a drain contact and a drain structure of a III-N transistor. The silicide may reduce the band gap between the source contact and source structure or between the drain contact and the drain structure. Reduction in bandgap may reduce electrical resistance and increase current through the III-N transistor. In other embodiments, the silicide is present between the source contact and the source structure and also between the drain contact and the drain structure. In an embodiment, when a silicide is present between the source contact and the source structure and also between the drain contact and the drain structure, contact resistance in the III-N transistor is reduced to a level below 1e-8 ohm-cm$^2$. In some examples, the silicide may be conformal with a topography of the source structure or the drain structure. In other examples, structures within the source or the drain structure, such as recesses, may lead to nanometer level variation in thickness of the silicide. Such nanometer level variation may not appreciably degrade III-N transistor performance.

A topography in the source or drain structure may arise from changes in chemical make-up of the source or drain structure. For example, changes in material composition, such as an increase or decrease in atomic percent of at least one chemical element in the source or drain structure may give rise to microstructures with different grain size, shape and boundaries. Examples of source and drain structures with different topography are provided in FIGS. 1A and 2A.

Figure 1B:
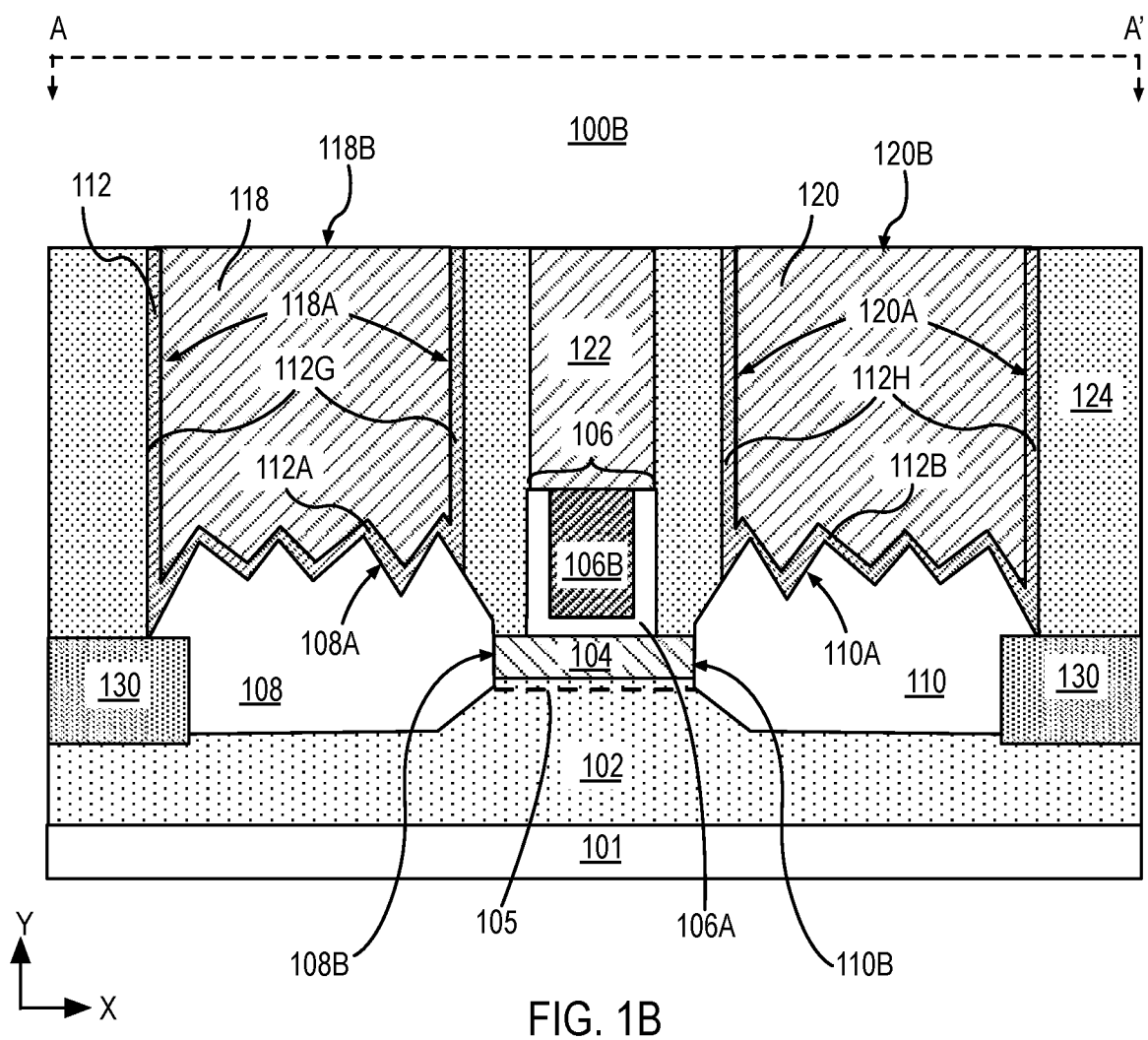
FIG. 1B illustrates a cross-sectional view of a III-N transistor having a silicide on the source and drain structures and on sidewalls of source and drain metallization structures, in accordance with embodiments of the present disclosure.
Figure 1D:
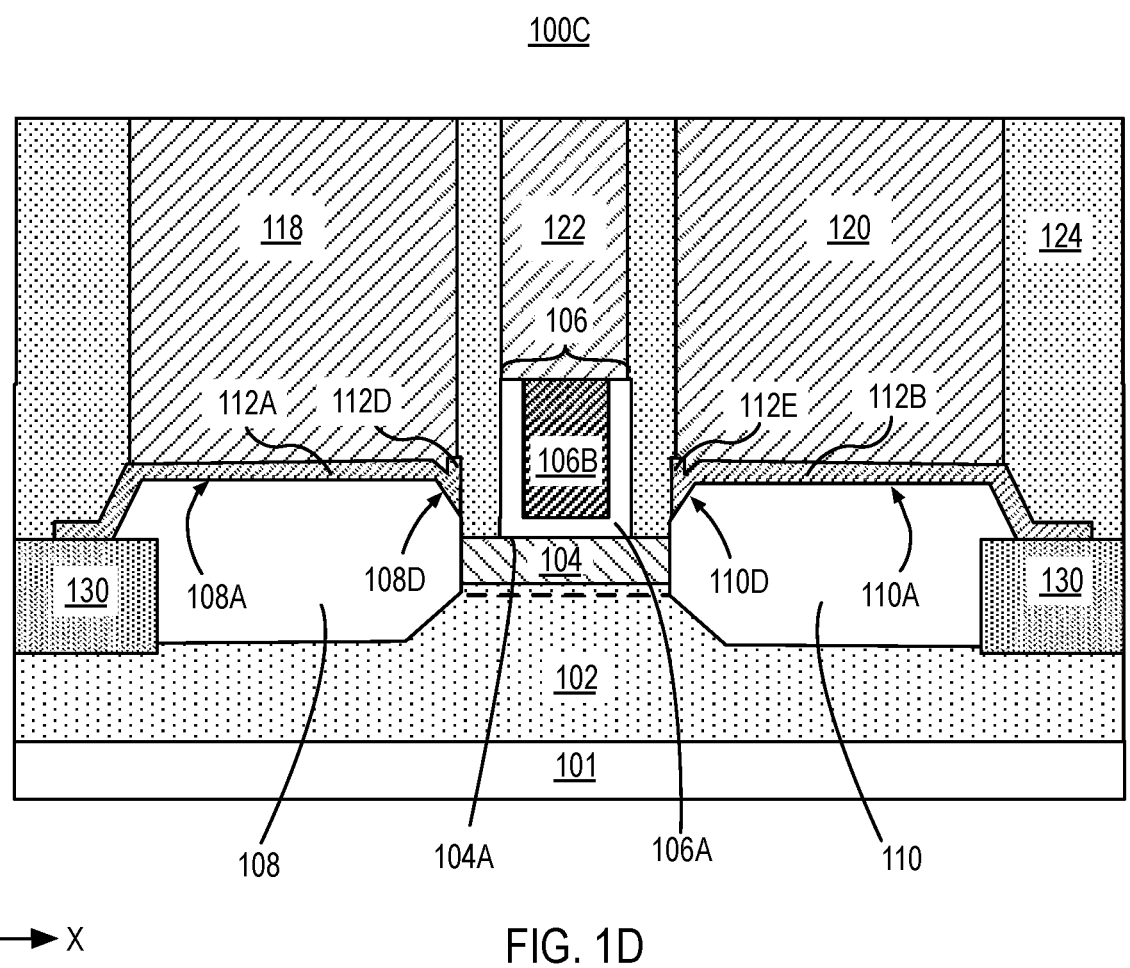
FIG. 1D illustrates a cross-sectional view of a III-N transistor having a silicide on source and drain structures having planar or substantially planar top surfaces, in accordance with embodiments of the present disclosure.
Figure 2A:
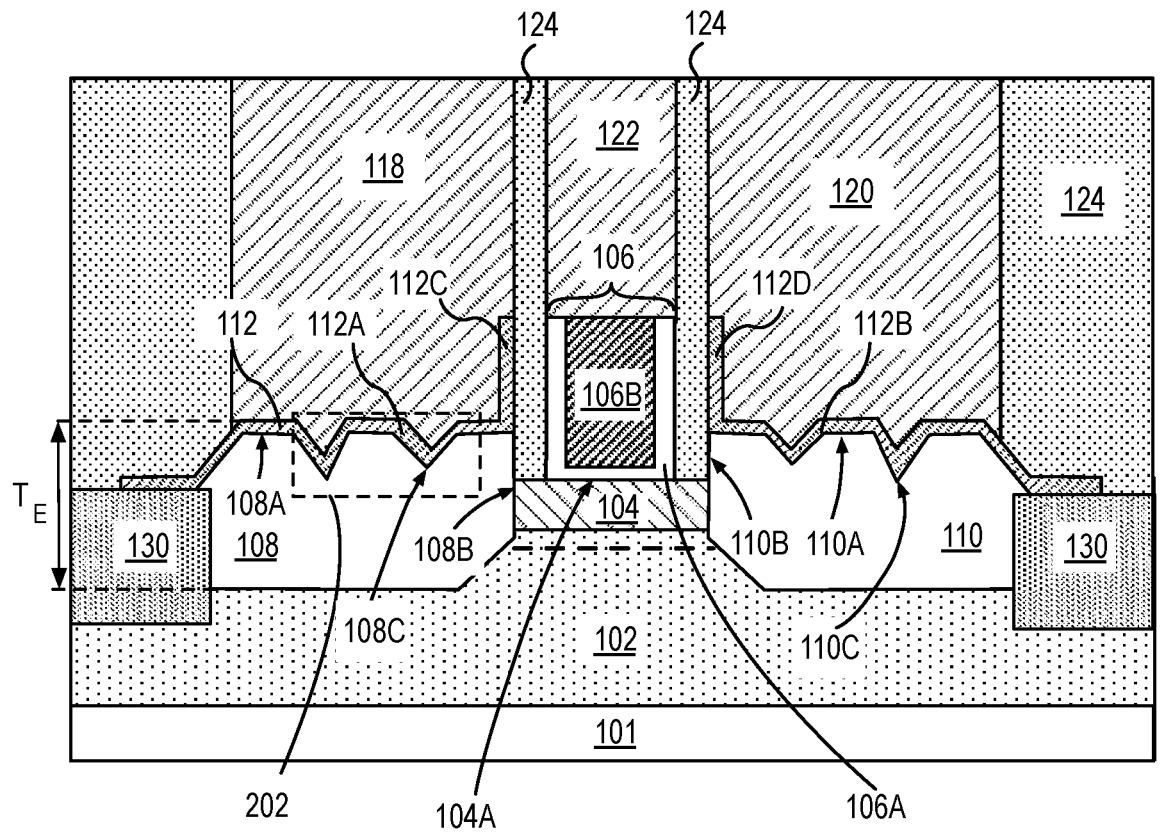
FIG. 2A illustrates a cross-sectional view of a III-N transistor having a silicide on source and drain structures, in accordance with embodiments of the present disclosure.

Some features of the silicide, such as silicide portions that are adjacent to dielectric materials, in the vicinity of the source or drain structure, may be indicative of the fabrication techniques utilized to form the III-N transistor. In some examples, the silicide may be formed at a different point in the process flow relative to the formation of the gate electrode of the III-N transistor. The choice of material and deposition temperatures associated with formation of the silicide may further influence when the silicide may be formed relative to the gate electrode. In some instances where a processing temperature required to form the silicide is higher than a processing temperature utilized to form the gate, the silicide is formed before a gate electrode as a higher processing temperature might otherwise adversely affect properties of the transistor. FIGS. 1A, 1D and 2A illustrate some examples of silicide features of III-N transistor structures where the silicide is formed before a gate electrode. In other instances, the silicide is formed after formation of a gate electrode, for example because the processing temperature required to form the silicide may be comparable or lower than the processing temperature utilized to form the gate. FIGS. 1B and 2D illustrate some examples of silicide features of III-N transistor structures where the silicide is formed after the gate electrode.

FIG. 1A illustrates a cross-sectional illustration of a device 100A, such as a III-N transistor structure 100A, including a channel layer 102 having a first III-N material. A polarization layer 104 is above the channel layer 102. Both layers 102 and 104 may be collectively referred to herein as "device layers." The polarization layer 104 includes another III-N material that induces a 2-dimensional carrier gas, such as a 2D electron gas (2DEG), as indicated by the dashed lines 105. 2DEG 105 is within channel layer 102 near an interface 126 between the polarization layer 104 and the channel layer 102. The transistor structure 100A further includes a gate structure 106 above the polarization layer 104, a source structure 108 on one side of the gate structure 106, and a drain structure 110 on the opposite side of the source structure 108. The III-N transistor structure 100A also includes a silicide 112 on at least a portion of the source structure 108. In the illustrative embodiment, the silicide 112 is also on at least a portion of the drain structure 110. The silicide 112 is separated from the gate structure 106 by a dielectric material 124. The III-N transistor structure 100A further includes interconnect metallization structures, such as a source contact 118 or a drain contact 120 to enable electrical connectivity with circuit nodes. In the illustrative embodiment, a source contact 118 is coupled through the silicide 112 to the source structure 108 and a drain contact 120 is coupled through the silicide 112 to the drain structure 110.

The silicide 112 provides a low band gap interface between the source structure 108 and the source contact 118 and between the drain structure 110 and the drain contact 120. A low band gap interface may facilitate a low contact resistance between the source structure 108 and source contact 118, and/or between the drain structure 110 and the drain contact 120. It is advantageous from a contact resistance perspective for the silicide 112 to be in contact with as much of a surface area of the source structure 118 or the drain structure 120 as possible. For example, the silicide 112 may be on all upper surfaces of the source structure 118 or the drain structure 120. In the illustrative embodiment, a silicide portion 112A is on a top surface 108A of the source structure 108 and a silicide portion 112B is on a top surface 110A of the drain structure 110. The silicide portion 112A may also wrap around sidewalls of the source structure 108 in a direction substantially orthogonal to the cross-sectional illustration in FIG. 1A, which may also beneficially increase contact surface area. Similarly, the silicide portion 112B may also wrap around sidewalls of the drain structure 110 in a direction substantially orthogonal to the cross-sectional plane in FIG. 1A.

During operation of III-N transistor structure 100A, electrical current flow between the source contact and source structure may be optimized when there is significant overlap between source contact, the silicide and the source structure. The amount of overlap may be dependent on the fabrication technique, as discussed further below. In the illustrative embodiment, the source contact 118 overlaps with the silicide portion 112A which spans across a width, WS, of the source structure 108 (along the X-direction). The source contact 118 may also overlap with the silicide portion 112A over the source structure 108 in a plane orthogonal to the cross-sectional illustration in FIG. 1A. The drain contact 120 may also overlap with the silicide portion 112B which spans across a width, $W_D$, of the drain structure 110 (along the X-direction), as shown. The drain contact 120 may also overlap with the silicide portion 112B over the drain structure 110 in a plane orthogonal to the cross-sectional illustration in FIG. 1A.

Some features of the silicide 112 may be indicative of the fabrication technique(s) utilized to form various components of the III-N transistor structure 100A. In some examples, portions of the silicide 112 may extend above the source structure 108 or the drain structure 110 if the silicide 112 is formed on a sidewall of a mask adjacent to the source structure 108 or the drain structure 110. In some such examples, the mask, or portions of the mask, may be subsequently removed, as will be described below. In an embodiment, a silicide layer portion 112C extends upward from the top surface 108A. In a further embodiment, a silicide layer portion 112D extends upward from the surface 110A. The silicide portion 112C and silicide portion 112D may be at a same level or substantially the same level. The silicide portion 112C may be at a same level or substantially the same level as the silicide portion 112A on the source structure 108. In the illustrative embodiment, the silicide portion 112C extends above the silicide portions 112A. The silicide portion 112C may extend above the silicide portions 112A by an amount, for example, between 20 nm and 40 nm. The silicide portion 112D may be at a same level or substantially the same level as the silicide portion 112B on the source structure 108. In the illustrative embodiment, the silicide portion 112D extends above the silicide portions 112B. The silicide portion 112D may extend above the silicide portions 112B by an amount, for example, between 20 nm and 40 nm.

In the illustrative embodiment, a silicide portion 112C extends upward from a level of the top surface 108A to a level of the top surface 106C of the gate structure 106, a feature that is also indicative of the processing operation utilized to form the silicide 112 and the gate structure 106. As illustrated, a silicide portion 112D extends upward from a level of the top surface 110A to a level of the top surface 106C of the gate structure 106. As shown, the silicide portions 112C and 112D are substantially vertical and are separated from the gate structure 106 by a separation, $W_{SG}$. In an embodiment, $W_{SG}$ is between 20 nm and 1000 nm. A separation, $W_{SG}$ of 20 nm, for example, may be adequate to electrically isolate the gate structure 106 from the source structure 108 or the drain structure 120.

In an embodiment, the silicide portions 112C and 112D each have a sidewall that is collinear with sidewalls 108B and 110B, respectively. In the illustrative embodiment, sidewalls 108B and 110B are directly adjacent to laterally opposite ends of the polarization layer 104. In one embodiment, the silicide portions 112C and 112D are separated from each other by a width that is substantially equal to a width, $W_{POL}$, of the polarization layer 104, as shown.

The silicide 112 may include silicon and one or more metals which provide silicide 112 with suitable bandgap and/or workfunction difference with III-N semiconductor of the source and drain. The silicide may form an ohmic or a Schottky/tunneling contact with III-N semiconductor. In an embodiment, the silicide 112 includes an alloy of silicon and at least one of titanium, nickel or aluminum. The silicide 112 may have a thickness that is between 3 nm and 15 nm to provide sufficient coverage over top surfaces 108A or 110A, respectively. It is advantageous for the silicide 112 to be contiguous on top surfaces 108A or 110A to avoid regions of high resistance between the contact structure 118 and the source structure 108 or between the contact structure 120 and the drain structure 110. In some examples, the silicide portions 112A or 112B may vary in thickness by at least 2 nm over top surfaces 108A or 110A, respectively. In other examples, the silicide portions 112A or 112B may vary in thickness by at least 2 nm over top surfaces 108A or 110A, respectively. The topography of the source structure 108 and the drain structure 110 may affect the thickness of the silicide 112 on the top surfaces 108A and 110A.

In some embodiments, the source structure 108 or the drain structure 110 has a non-planar topography. The topography may be dependent on the III-N material(s) and on relative concentration of the one or more materials of the source structure 108 or the drain structure 110. In some embodiments, the source structure 108 and the drain structure 110 include indium, gallium and nitrogen. In some such embodiments, the indium level may be between 10-15 atomic percent of the material composition of the III-N material. In an embodiment where the source structure 108 or the drain structure 110 includes indium, gallium and nitrogen and the indium level is between 10-15 atomic percent of the material composition of the III-N material, the source structure 108 or the drain structure 110 is polycrystalline. Such a polycrystalline source structure 108 and drain structure 110 may have non-planar top surfaces 108A and 110A due to a large grain size. Topography of a polycrystalline source structure 108 or drain structure 110 may be further characterized by recesses in the top surface 108A and 110A, respectively. In the illustrative embodiment, the III-N material of the source structure 108 is polycrystalline, and the source structure 108 has a top surface 108A that is non-planar with recesses 108C. The recesses 108C may have a depth that ranges between 5 nm to 25 nm as measured from a highest point on the top surface 108A. In the illustrative embodiment, the III-N material of the drain structure 110 is also polycrystalline. The drain structure 110 has a top surface 110A that is non-planar with recesses 110C, as shown in FIG. 1A. The recesses 110C may have a depth that ranges between 5 nm to 25 nm as measured from a highest point on the top surface 110A.

In an embodiment, the recesses 108C and 110C have sidewalls that are faceted. In one example where the uppermost surface 104A is substantially the c-plane of polarization layer 104, sidewalls of recesses 108C and 110C are faceted at approximately 60 degrees with respect to the uppermost surface 104A. When the top surfaces 108A and 110A have recesses 108C and 110C as illustrated, the silicide 112 may approximately follow a shape of the recesses 108C and 110C. As shown, the silicide 112 is contiguous within the recesses 108C and 110C.

In an embodiment, the source structure 108 and the drain structure 110 include a III-N material that is lattice matched to the channel layer 102. The source structure 108 and the drain structure 110 may for example, include GaN or InGaN. In an exemplary embodiment, the source structure 108 and the drain structure 110 include an impurity dopant such as an n-type dopant or an n+ dopant. Examples of an n-type dopant include a material such as Si or Ge. In one embodiment, the n-type dopant material is silicon. As a further example, the silicon n-type dopant may have a n-type dopant density of at least 1e19/cm$^3$.

In some embodiments, the source structure 108 has a maximum thickness, $T_{SE}$ that is between 60 nm and 100 nm. The thickness, $T_{SE}$, may vary across the width of the source structure 108 due to III-N material microstructure (e.g., polycrystallinity) of the source structure 108, as shown. In some embodiments, the drain structure 110 has maximum thickness, $T_{DE}$, that is between 60 nm and 100 nm. The thickness, $T_{SE}$, may vary across the width of the drain structure 110 due to the polycrystallinity of the III-N material of the drain structure 110, as shown.

In an embodiment, the channel layer 102 includes a III-N material such as gallium nitride (GaN). In one such embodiment, the channel layer 102 has a relatively high carrier mobility, (greater than 500 cm$^2$ V$^{-1}$). The channel layer 102 may be a substantially un-doped III-Nitride material (e.g., $O_2$ impurity concentration minimized) for minimal impurity scattering. In other embodiments, the channel layer 102 includes one or more ternary alloys of GaN, such as AlGaN, AlInN, or a quaternary alloy of GaN including at least one group III element and nitrogen, such as $In_XAl_YGa_{1-X-Y}N$, where "X" ranges from 0.01-0.1 and "Y" ranges from 0.01-0.1. The channel layer 102 may have thickness between 100 nm and 5 um.

In an embodiment, the polarization layer 104 includes a suitable second III-N material. In an embodiment, the polarization layer 104 includes a material such as, but not limited to, $Al_ZGa_{1-Z}N$, $Al_WIn_{1-W}N$, or AlN, where "Z" ranges from 0.2-0.3 and "W" ranges from 0.7-0.85. One combination includes a polarization layer 104 of AlGaN and a channel layer 102 of GaN. In an embodiment, the polarization layer 104 has a thickness sufficient to introduce a polarization difference in the interface 126 between the channel layer 102 and the polarization layer 104, creating a 2DEG in the vicinity of an uppermost surface of the channel layer 102. Depending on the choice of material, the polarization layer 104 has a thickness between 3 nm and 20 nm. In an exemplary embodiment, the polarization layer 104 is AlInN, a thickness between 3 nm and 10 nm. The presence of the 2DEG may support current conduction in the channel layer 102 between the source structure 108 and the drain structure 110 in the III-N transistor structure 100A. In the illustrative embodiment, by biasing the gate 106 (e.g., negatively) relative to the source contact 110, such current conduction may be modulated (e.g., turned off).

In an embodiment, the gate structure 106 includes a combination of gate electrode layers. In other embodiments, the gate structure 106 includes a gate dielectric layer 106A and a gate electrode 106B. In the illustrative embodiment, the gate structure 106 includes a gate electrode 106B and a gate dielectric layer 106A between the polarization layer 104 and the gate electrode 106B, and adjacent to sidewalls of the gate electrode 106B. The gate dielectric layer 106A may have a high relative permittivity (i.e., dielectric constant, or K, exceeding that of silicon nitride). In some high-K gate dielectric embodiments, the gate dielectric layer 106A is a metal oxide (e.g., including oxygen and one or more metals, such as, but not limited to, aluminum, hafnium, zirconium, tantalum or titanium). In another embodiment, the gate dielectric layer 106A includes silicon and at least one of oxygen (e.g., silicon dioxide) or nitrogen (e.g., silicon nitride). In some examples, the gate dielectric layer 106A has a thickness between 2 nm and 10 nm.

In an embodiment, the gate electrode 106B includes a metal such as, but not limited to, Pt, Ni and an alloy such as TiN or TaN. In one such embodiment, the gate electrode 106B has a gate length, $L_G$, approximately between 10 nm and 100 nm. In some embodiments, the gate electrode 106B further includes a work function metal and a gate cap. The work function metal may include a metal such as Pt, Ni, and an alloy such as TiN or TaN and the gate cap may include a metal, such as W, for example.

In the illustrative embodiment, the III-N transistor structure 100A further includes at least one isolation structure 130 for electrical isolation from an adjacent III-N transistor. In the illustrative embodiment, the III-N transistor structure 100A includes isolation structures 130A and 130B adjacent to the source structure 108 and drain structure 110, respectively. The isolation structures 130A and 130B provides electrical isolation between adjacent III-N transistors. The isolation structures 130A and 130B may also provide a buffer region for lateral overgrowth of the source structure 108 and drain structure 110, as illustrated. Isolation structures 130A and 130B include any material that has sufficient dielectric strength to provide electrical isolation such as, but not limited to, silicon dioxide, silicon nitride, silicon oxynitride, carbon doped nitride and carbon doped oxide.

In the illustrative embodiment, the source contact 118, the drain contact 120 and the gate 106 are adjacent to a dielectric material 124. Examples of the dielectric material 124 may include any material that that has sufficient dielectric strength to provide electrical isolation such as, but not limited to, silicon dioxide, silicon nitride, silicon oxynitride, carbon doped nitride and carbon doped oxide. In an embodiment, the dielectric material 124 includes a material that is the same or substantially the same as the material of the isolation structures 130A and 130B.

In an embodiment, the substrate 101, includes a semiconductor material such as but not limited to silicon, silicon germanium (Ge) or silicon carbide (SiC). In an exemplary embodiment, the substrate 101 is a silicon substrate having a (100) top surface. A silicon substrate 101 with a (100) top surface enables co-integration of silicon CMOS transistor technology with a III-N material. In a second embodiment, the silicon substrate 101, has a (111) top surface. In embodiments, the channel layer 102 and the substrate 101 have mismatched lattice structures. The lattice mismatch between the channel layer 102 and the substrate 101 may be between 15%-50%.

As discussed above, in some embodiments, the silicide is formed after the formation of a gate structure. One characteristic of such embodiments is a silicide that extends above the gate structure, and/or that has a height substantially equal to that of a source contact or a drain contact. Another characteristic indicative of "silicide last" type fabrication is the presence of silicide on a portion of the source structure or the drain structure. FIG. 1B illustrates a cross sectional view of a II-N transistor structure 100B, where the silicide 112 extends above the gate structure 106. In an embodiment, the silicide 112 is adjacent to the source contact 118 or drain contact 120. As shown, a silicide portion 112G is adjacent to sidewalls 118A of the source contact 118, and has a top portion that is at the level of the source contact surface 118B. As shown, a silicide portion 112H is adjacent to sidewalls 120A of the drain contact 120 and has a top portion that is at the level of the drain contact surface 120B.

Notably, the silicide portion 112A may be in contact with only a portion of the top surface 108A of the source structure 108. In the illustrative embodiment, the silicide portion 112A is in contact with a majority of the top surface 108A. As shown, the silicide portion 112A does not extend to a point directly above the substantially vertical sidewall 108B. In other embodiments, the silicide portion 112A extends to a point directly above the substantially vertical sidewall 108B. The silicide portion 112A may also be in contact with a portion of the top surface 108A in a direction orthogonal to the cross-sectional illustration in FIG. 1B (not shown). In another embodiment, the silicide portion 112A is in contact with majority of the top surface 108A, in a direction orthogonal to the cross-sectional illustration in FIG. 1B (not shown).

In an embodiment, the silicide portion 112B is in contact with only a portion of the top surface 110A. In the illustrative embodiment, the silicide portion 112B is in contact with a majority of the top surface 110A. As shown, the silicide portion 112B does not extend to a point directly above the substantially vertical sidewall 110B. In other embodiments, the silicide portion 112B extends to a point directly above the substantially vertical sidewall 110B. The silicide portion 112B may also be in contact with a portion of the top surface 110A in a direction orthogonal to the cross-sectional illustration in FIG. 1B (not shown). In another embodiment, the silicide portion 112B is in contact with majority of the top surface 110A, in a direction orthogonal to the cross-sectional illustration in FIG. 1B (not shown).

Figure 1C:
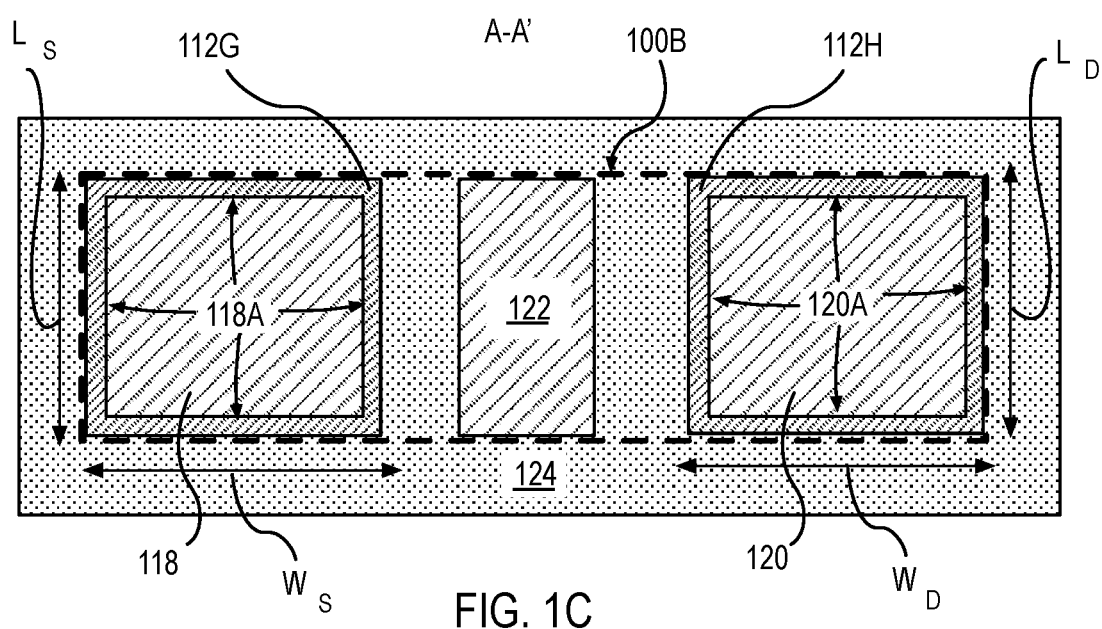
FIG. 1C illustrates a plan-view illustration of the structure in FIG. 1B depicting the silicide on the sidewalls of source and drain metallization structures, in accordance with embodiments of the present disclosure.

FIG. 1C illustrates a plan-along a line A-A', of the structure in FIG. 1B. In the illustrative embodiment, the silicide portion 112G is adjacent to sidewalls 118A and laterally surrounds the source contact 118. The silicide portion 112H is likewise adjacent to sidewalls 118A and laterally surrounds the source contact 118, as shown. An outline of the transistor structure 100B is indicated by the dashed lines. The transistor structure 100B may have a footprint that is larger or smaller than, as is, indicated by the dashed line. For example, the footprint may depend on length, $L_S$, and width, $W_S$ of the source structure 108 (not visible in the plan-view illustration) and on length, $L_D$, and width, $W_D$ of the drain structure 110 (not visible in the plan-view illustration).

In some embodiments, the source and drain structure of the III-N transistor may undergo processing prior to formation of the silicide. Such processing may minimize variations in thickness of the source and/or drain structure across a large number of similar III-N transistors. FIG. 1D illustrates a cross-sectional view of a III-N transistor structure 100C having a silicide 112 on a source structure 108 and on a drain structure 110 having predominantly planar top surfaces 108A and 110A, respectively. The predominantly planar top surfaces 108A and 110A may have microstructures such as recesses that are significantly shallower compared to the recesses 108C and 110C illustrated in FIG. 1A. Such shallower recesses are not illustrated in FIG. 1D. While top surfaces 108A and 110A, as illustrated, are both predominantly planar, in other examples (not shown) only the top surface 108A or the top surface 110A may be planar.

In the illustrative embodiment, silicide 112A has a profile that is predominantly planar on the planar top surface 108A. As shown, the silicide layer 112 also has a portion 112D that extends on and above a sidewall 108D. In an embodiment, the silicide portion 112D has a top portion that is at a same level or substantially the same level as a level of the silicide portion 112A. In other embodiments, the silicide portion 112D extends above a level of the silicide portion 112A (not shown). Such differences in level of the top portion of the silicide 112D may arise from different fabrication processes.

In the illustrative embodiment, the silicide 112B has a profile that is predominantly planar on the planar top surface 110A. As shown, the silicide layer 112 also has a portion 112E that extends on and above a sidewall 110D. In an embodiment, the silicide portion 112E has a top portion that is at a same level or substantially the same level as a level of the silicide portion 112B. In other embodiments, the silicide portion 112E extends above a level of the silicide portion 112B (not shown). Such differences in level of the top portion of the silicide 112E may arise from different fabrication processes.

As discussed above, the structural features of a source or drain structure may depend on the chemical composition of the material of the source or drain structure. In some examples, small changes in atomic percent of a single element can be associated with different structural features, such as profiles of top surfaces, and/or characteristics of recesses within the source and drain structures. In some embodiments, the source structure or a drain structure has a top surface that is predominantly planar with recesses having polygonal boundaries.

FIG. 2A illustrates a cross-sectional view of a III-N transistor 200A where the source structure 108 and drain structure 110 have predominantly planar top surfaces 108A and 110A, respectively. As shown, the top surface 108A includes recesses 108C. In an embodiment, the surface 108A extends above the top surface 104A of the polarization layer 104. In other embodiments, the top surface 108A is co-planar or substantially co-planar with the top surface 104A. In an embodiment, source structure 108 has a sidewall 108B that is vertical or substantially vertical and intersects the planar top surface 108A between 85 and 90 degrees.

The planarity of top surfaces of the source or drain structure, and the shape and/or size of recesses, may be dependent on the choice of materials and on relative concentration of one or more materials in the source or drain structure. In some embodiments, the source structure 108 includes a III-N material including indium, gallium and nitrogen. In some such embodiments, the indium level may be between 1-3 atomic percent of the material composition of the III-N material. In an embodiment where the source structure 108 includes indium, gallium and nitrogen, and the indium level is between 1-3 atomic percent of the material composition of the III-N material, the source structure 108 is substantially monocrystalline. Such a monocrystalline source structure 108 may have a predominantly planar top surface 108 that is associated with a crystal facet. In an embodiment, the source structure 108 has a thickness, $T_E$. In an embodiment, $T_E$ is between 40 nm and 100 nm.

The monocrystalline source structure 108 may further include recesses 108C in the predominantly planar top surface 108A. The recesses 108C may vary in width and depth as inferred from cross sectional illustrations of the source structure 108 in FIGS. 2A and 2B.

Figure 2B:
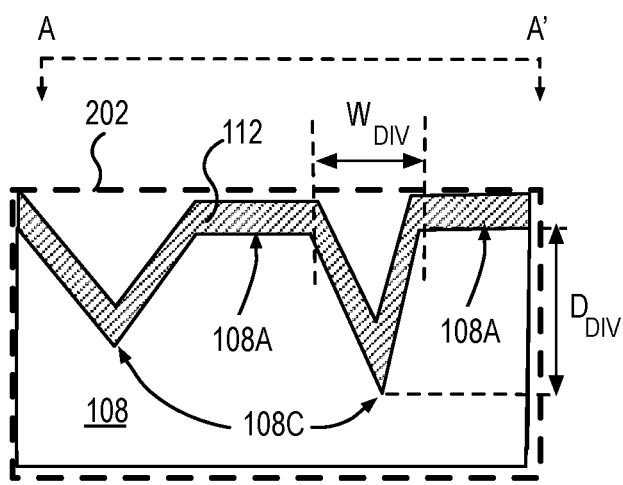
FIG. 2B illustrates an enhanced cross-sectional view of a portion of a drain structure of the III-N transistor in FIG. 2A, in accordance with embodiments of the present disclosure.

FIG. 2B illustrates an expanded cross-sectional view of a portion of the source structure 108 demarked in FIG. 2A by dashed line 202. FIG. 2B further illustrates the relative shape and size of recesses 108C across a cross section of the source structure 108. Each of the recesses 108C may have a different width, $W_{DIV}$, and a different depth, $D_{DIV}$, as illustrated, where the depth is measured relative to the top surface 108A. In an embodiment, the different depth, $D_{DIV}$, of the micro-recess 108C is between 30-70% of the thickness, $T_E$, of the source structure 108. In an embodiment, the micro-recess 108C has a width $W_{DIV}$, of at least 100 nm. The recesses 108C may have sloped sidewalls. In some examples, such as is illustrated, the sloped sidewalls can vary with the size of the recesses 108C. The slope can range between 50 and 60 degrees with respect to the top surface 108A. The density of recesses 108C in the source structure 108 may be dependent on a cross sectional area of the source structure 108 (as defined by the X and Z axis in FIG. 2B). A source structure 108 having a width (along an X-axis in FIG. 2B) between 100 nm and 2 microns can have at least two recesses 108C.

Figure 2C:
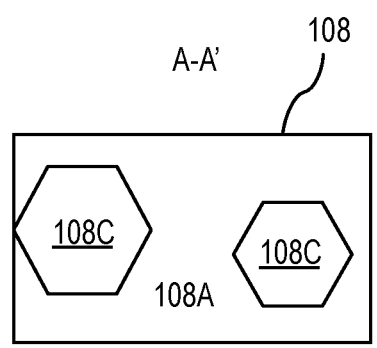
FIG. 2C illustrates a plan-view illustration of the structure in FIG. 2B depicting the recesses on surface of the drain structure, in accordance with embodiments of the present disclosure.
Figure 2D:
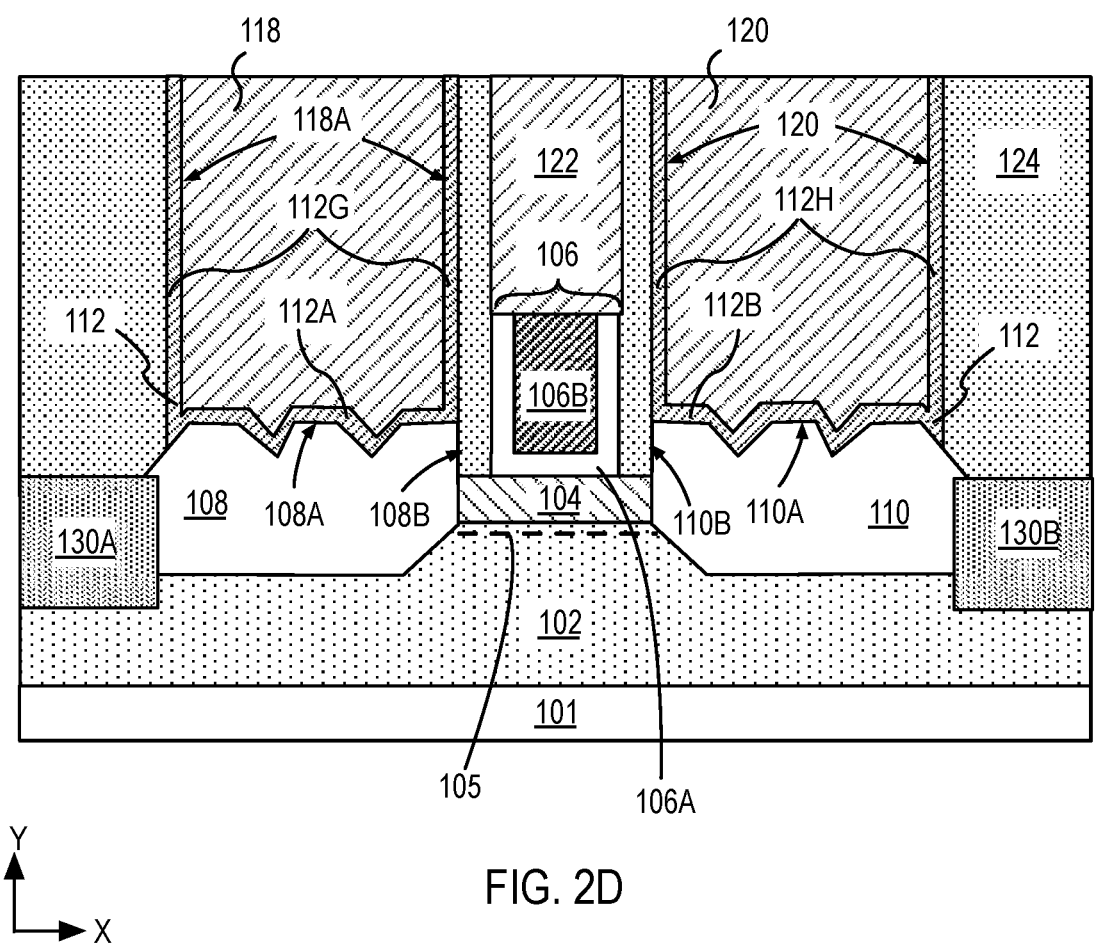
FIG. 2D illustrates a cross-sectional view of a III-N transistor having a silicide on the source and drain structures and on sidewalls of source and drain metallization structures, in accordance with embodiments of the present disclosure.

The recesses 108C in the source structure 108 depicted in FIGS. 2A and 2B may have polygonal boundaries, as further illustrated in the plan view illustration of FIG. 2C. FIG. 2C is a plan-view illustration of the structure in FIG. 2B (along a cut A-A') where the silicide 112 is not illustrated for clarity. In the illustrative embodiment, each of the recesses 108C have a substantially hexagonal shaped boundary. The hexagonal shaped boundaries may have a same or substantially the same size. In the illustrative embodiment, each of the recesses 108C have a substantially hexagonal shaped boundary that have a different size.

Referring once again to FIG. 2A, when the top surface 108 includes recesses 108C, the silicide 112 may approximately follow a shape of the recesses 108C. As shown, the silicide portion 112A follows a surface texture of the source structure 108 and is contiguous within the recesses 108C. In some embodiments, the silicide portion 112A has a thickness on the planar top surface 108A that may be different from a thickness within the recesses 108C. In other embodiments, the silicide portion 112A has a thickness on the planar top surface 108A that is substantially similar to a thickness within the recesses 108C. In the illustrative embodiment, the silicide 112 has a portion 112C that extends upwards from the top surface 108A along a portion of a sidewall of the dielectric material 124 adjacent to the gate 106. As shown, the silicide portion 112C has a top portion that is at a level of the top surface 106C of the gate structure 106, which is indicative of fabrication process utilized to form the III-N transistor. In other embodiments, the silicide 112 is in contact with the sidewall of the dielectric material 124 but does not extend upward along the sidewall of the dielectric material 124.

In some embodiments, the drain structure 110 also has one or more of the features of the source structure 108, including the III-N material, topography of top surface and shape and size of microstructures. Also, for example, a density of recesses 110C (or depth $D_{DIV}$, height $D_{DIV}$, or shape) of one or more recesses 110C may be similar to the density (or depth $D_{DIV}$, height $D_{DIV}$, or shape) of one or more recesses 108C. Because the recesses 110C and 108C may be randomly located, the spacing between recesses 110C may be different from spacing between the recesses 108C.

In some embodiments, a silicide portion 112B that is on the top surface 110A also has one or more of the features of the silicide portion 112A, such as material and thickness. In the illustrative embodiment, silicide portion 112D may also include one or more features of the silicide portion 112C, such as extending along a sidewall of the dielectric material 124.

Figure 3:
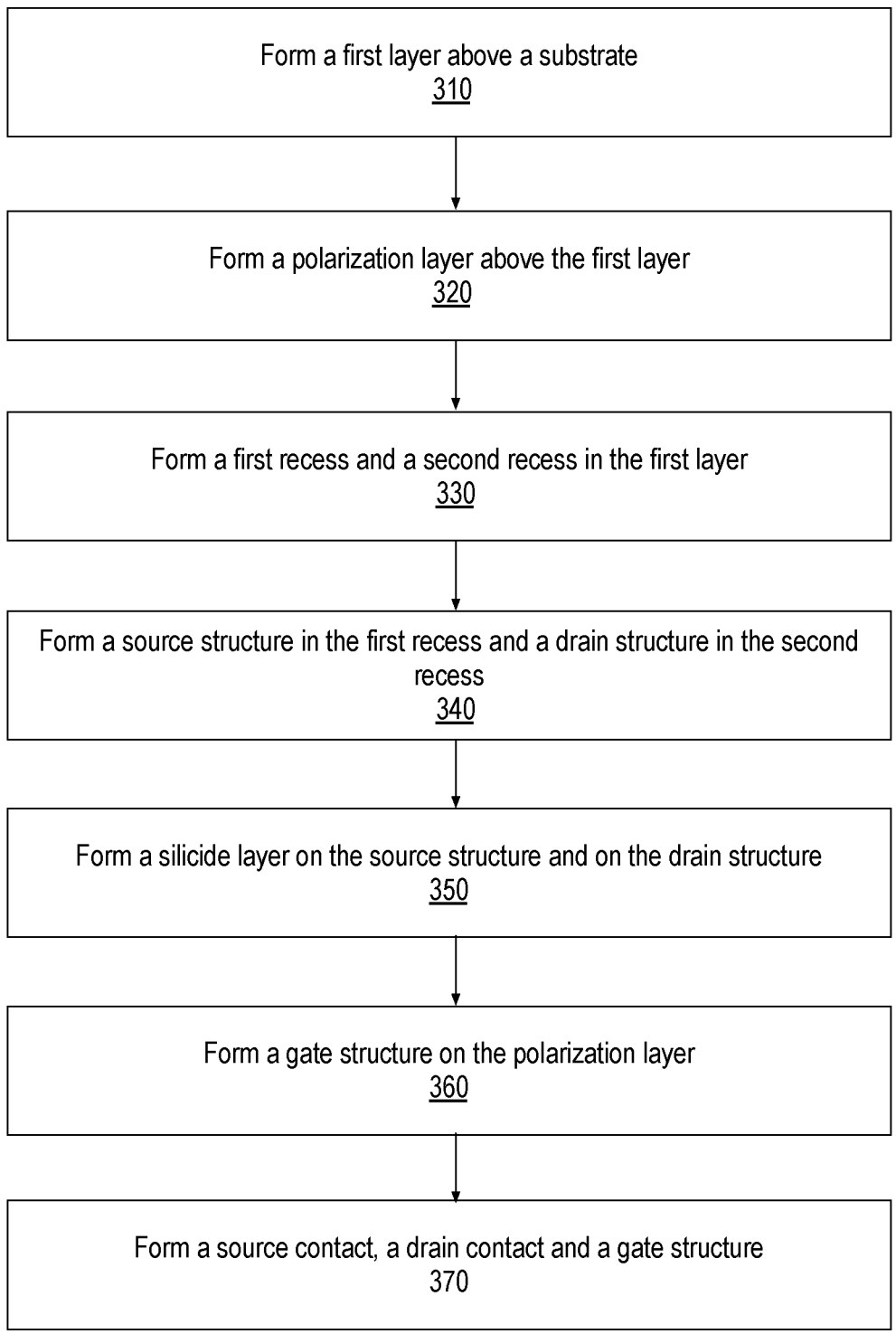
FIG. 3 is a flow diagram of a method to fabricate the III-N transistor in FIG. 1A, in accordance with embodiments of the present disclosure.

FIG. 3 is a flow diagram of a method 300 to fabricate the III-N transistor in FIG. 1A, in accordance with embodiments of the present disclosure. In an embodiment, the method 300 begins in operation 310 by forming a III-N material above a substrate. The method 300 continues in operation 320 by forming a polarization layer on the III-N material. The method 300 continues in operation 330 by forming a first and a second recess in the polarization layer and in the III-N material using a mask. The method 300 continues in operation 340 by forming a source structure in the first recess and a drain structure in the second recess. The method 300 continues in operation 350 by forming a silicide on the source structure and on the drain structure and on the mask. The method 300 continues in operation 360 by removing the silicide from the mask and forming a gate structure on the polarization layer. The method 300 continues in operation 370 by forming a source contact on the source structure, a drain contact on the drain structure and a drain contact on the drain structure.

Figure 4A:
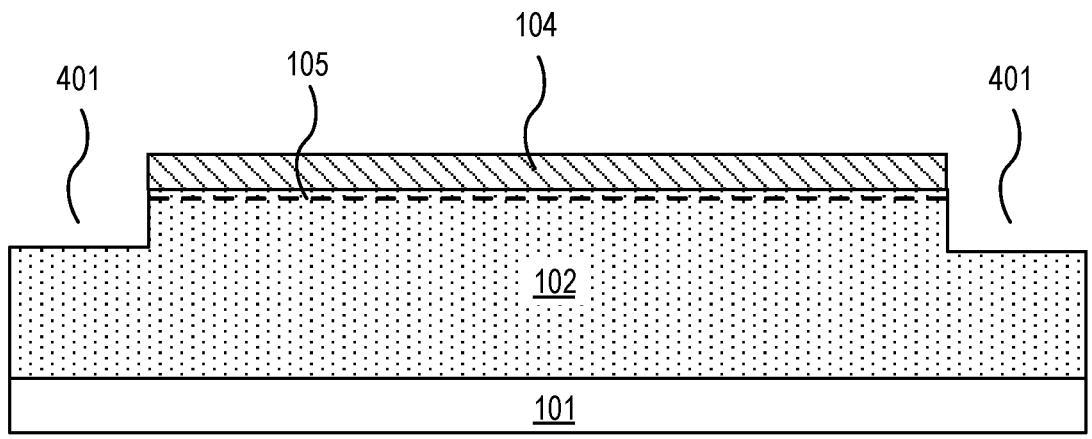
FIG. 4A illustrates a cross-sectional view of a patterned polarization layer on a patterned first III-N material, in accordance with an embodiment of the present disclosure.
Figure 4B:
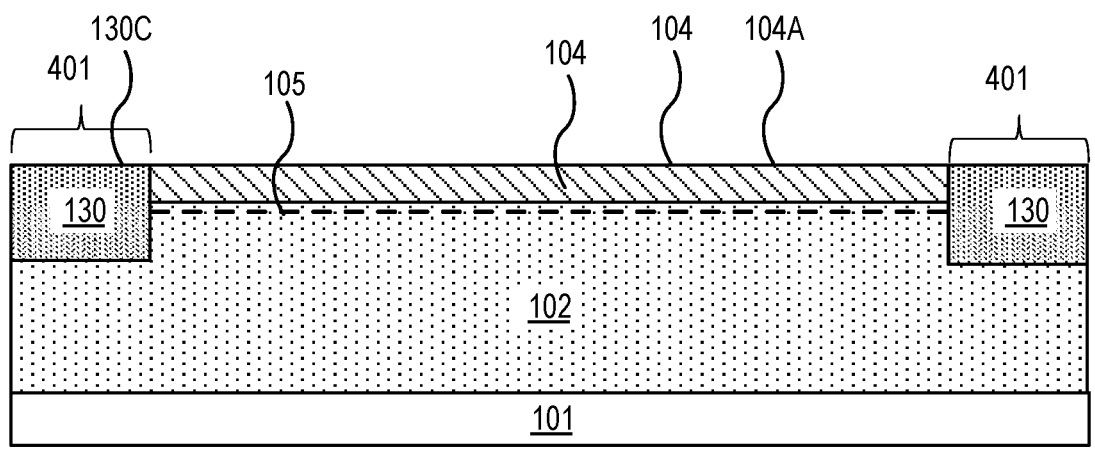
FIG. 4B illustrates the structure of FIG. 4A, following the formation of isolation structures in the polarization layer and in the III-N material.
Figure 4C:
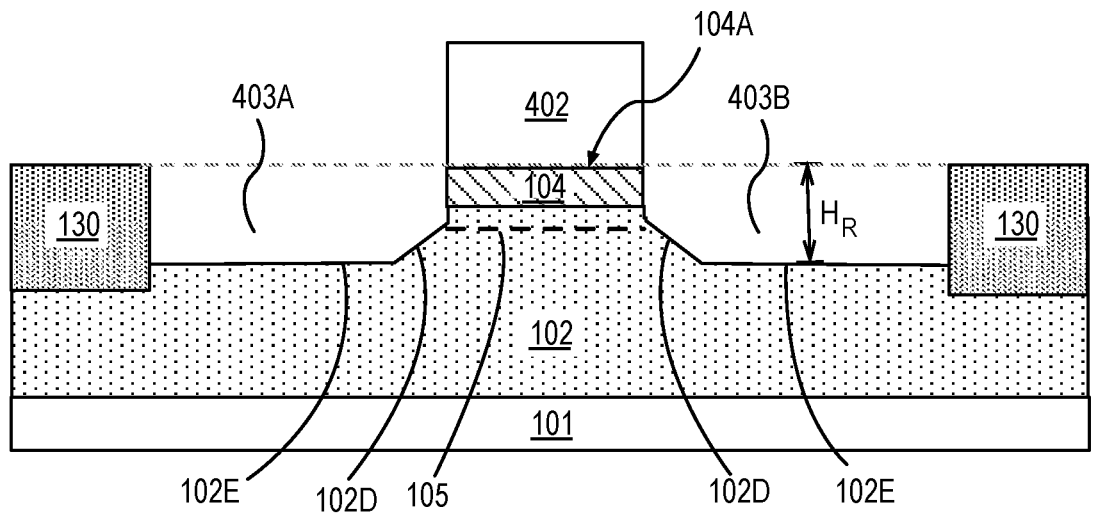
FIG. 4C illustrates the structure of FIG. 4B, following the formation of trenches in portions of the polarization layer, and in portions of the III-N material adjacent to the isolation structures.
Figure 4D:
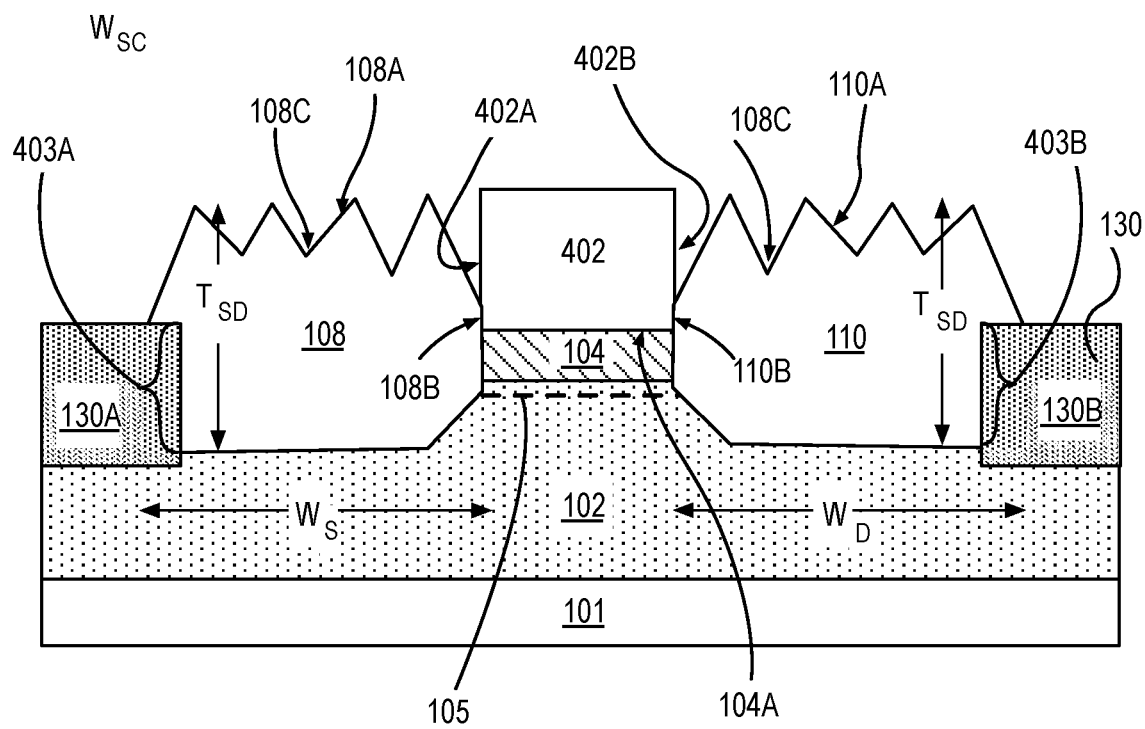
FIG. 4D illustrates the structure of FIG. 4C, following the formation of drain structures and source structures in the trenches.
Figure 4E:
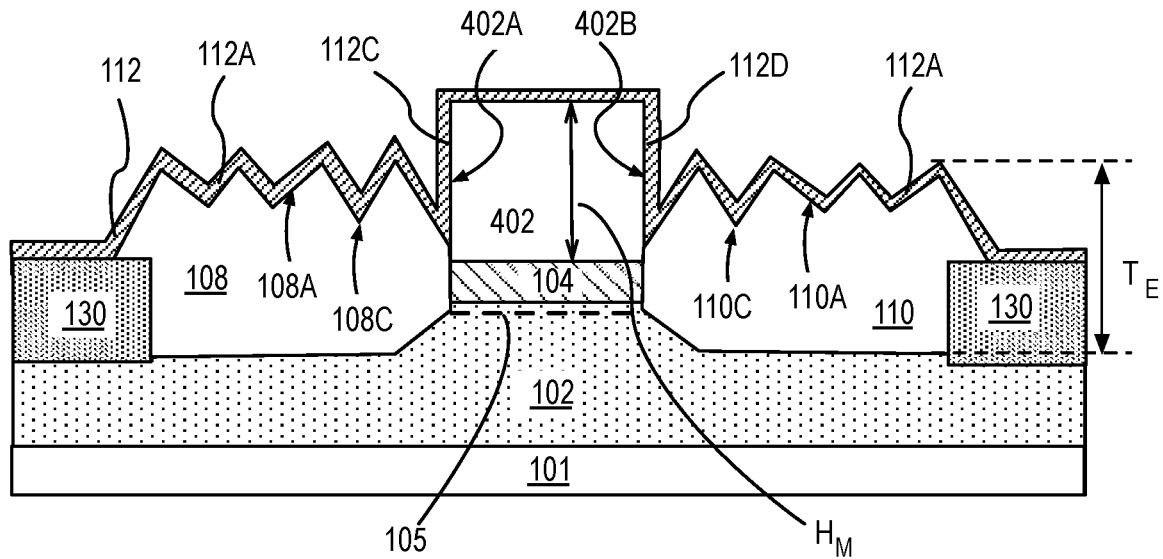
FIG. 4E illustrates the structure of FIG. 4D, following the formation of a silicide on the source structure, on the drain structure, on the hardmask, and on the isolation.
Figure 4F:
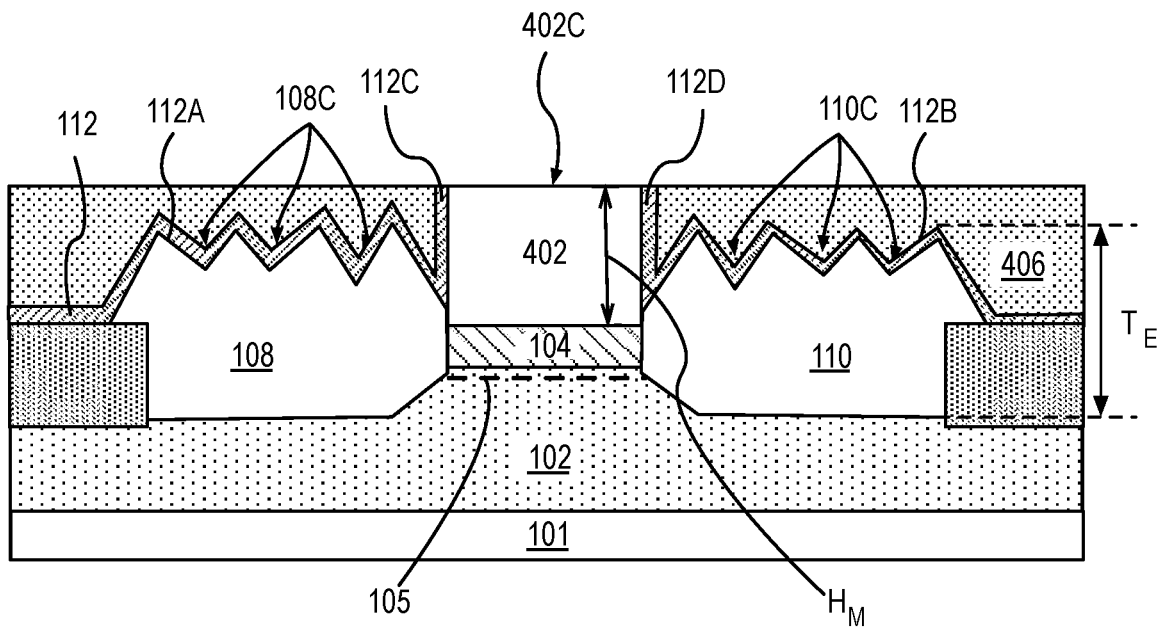
FIG. 4F illustrates the structure of FIG. 4E, following the formation of a first dielectric material on the silicide, and following the planarization of the first dielectric material, portions of the silicide on the mask and a top portion of the mask.
Figure 4G:
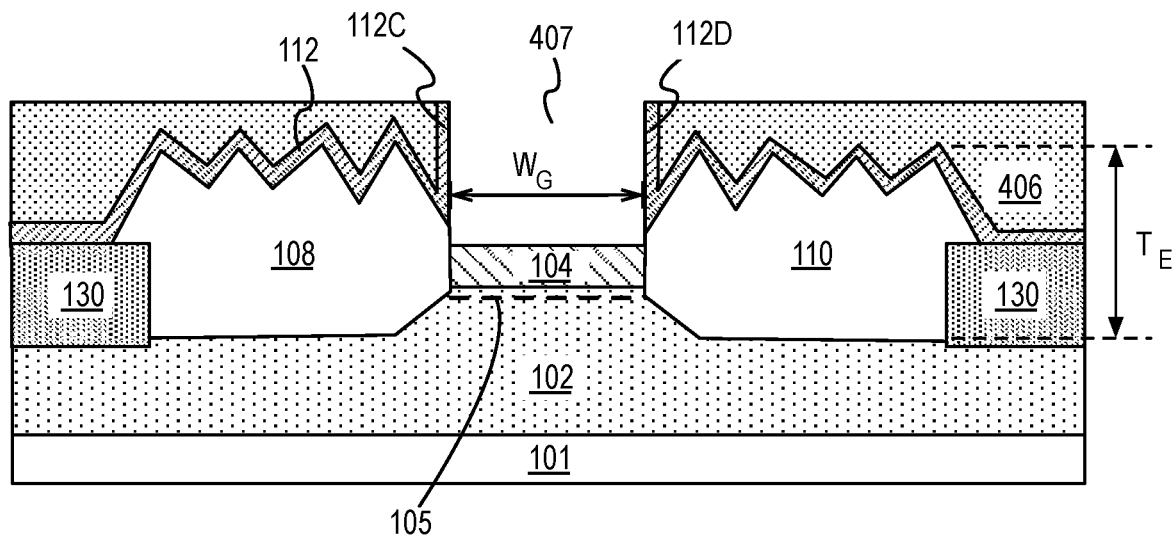
FIG. 4G illustrates the structure of FIG. 4F, following the removal of the mask selective to the dielectric material and to the silicide to expose the uppermost surface of the polarization layer.
Figure 4H:
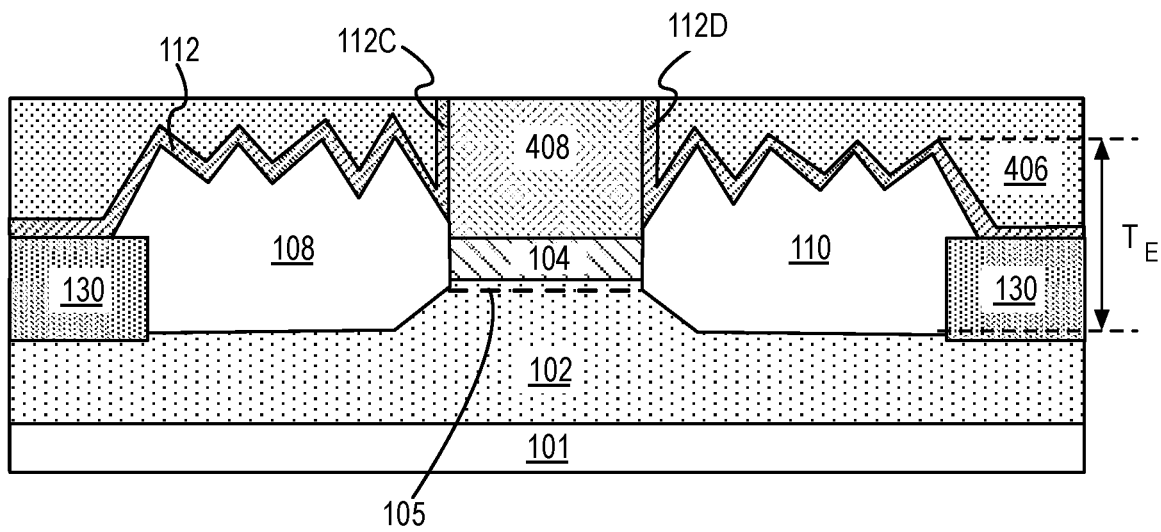
FIG. 4H illustrates the structure of FIG. 4F, following the formation of a second dielectric material on the first dielectric material, on the silicide, and on the exposed uppermost surface of the polarization layer, followed by planarization of the second dielectric material.
Figure 4I:
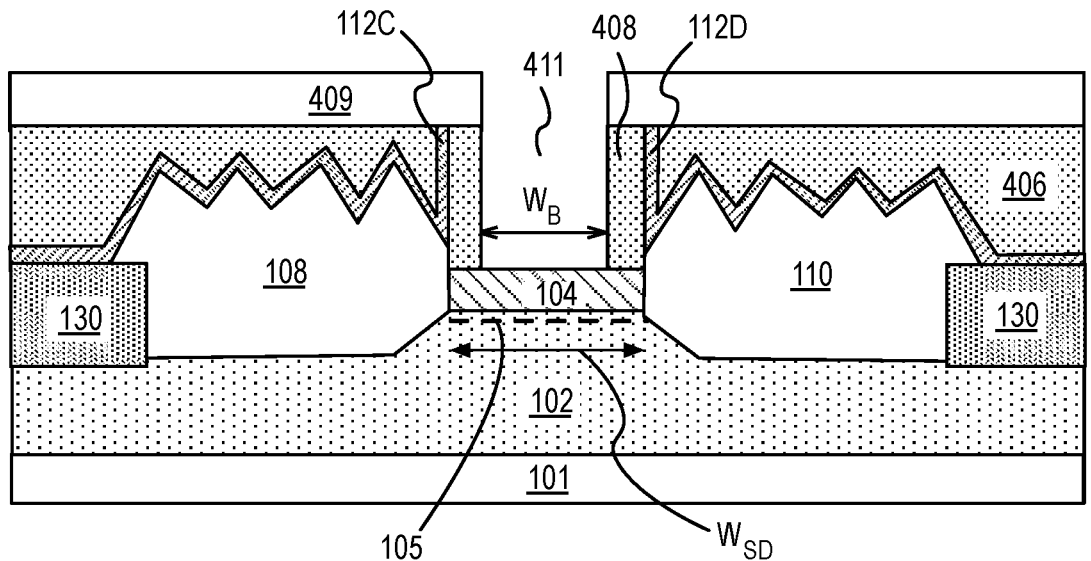
FIG. 4I illustrates the structure of FIG. 4H, following the formation of a mask and a gate opening in the second dielectric material to expose a portion of the polarization layer.
Figure 4J:
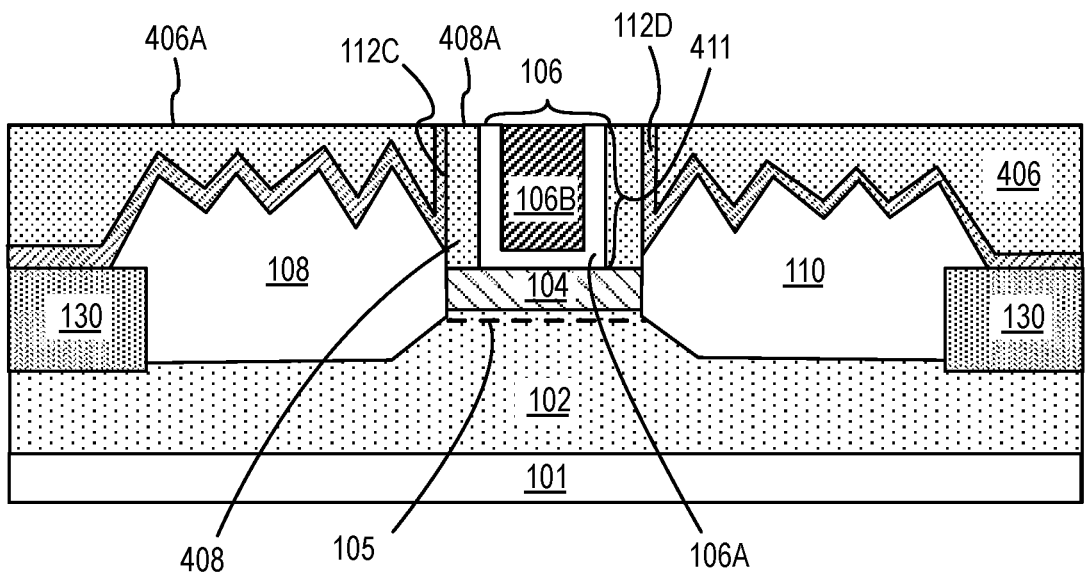
FIG. 4J illustrates the structure of FIG. 4I, following the formation of a gate in the gate opening.
Figure 4K:
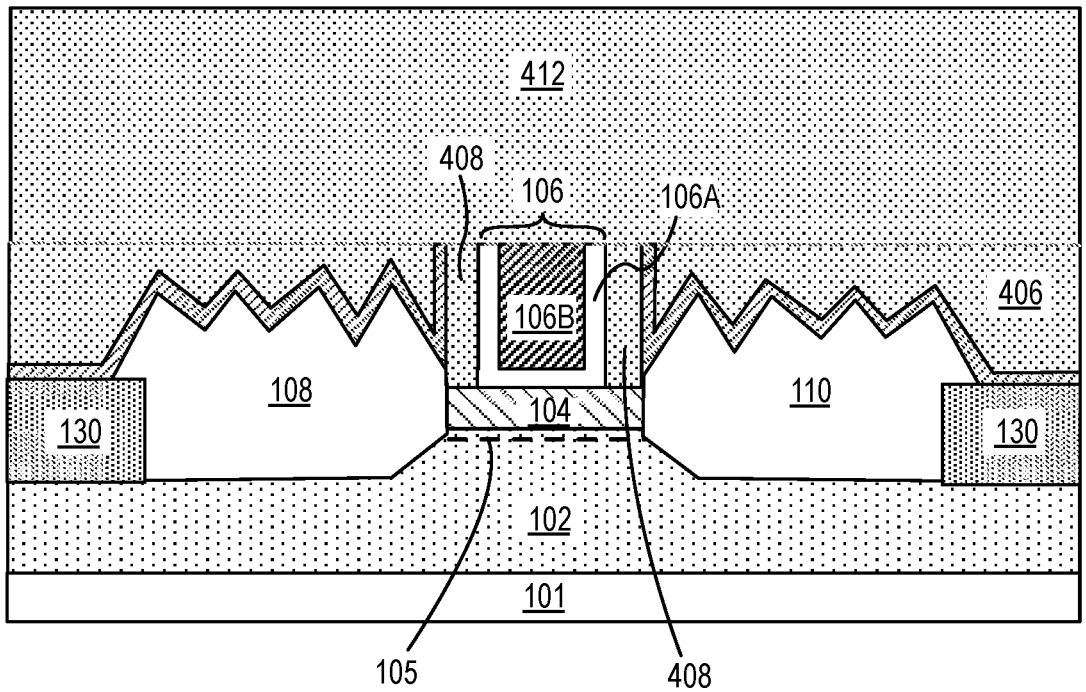
FIG. 4K illustrates the structure of FIG. 4J, following the deposition of a third dielectric material on the second dielectric material, on the gate and on the second dielectric material.
Figure 4L:
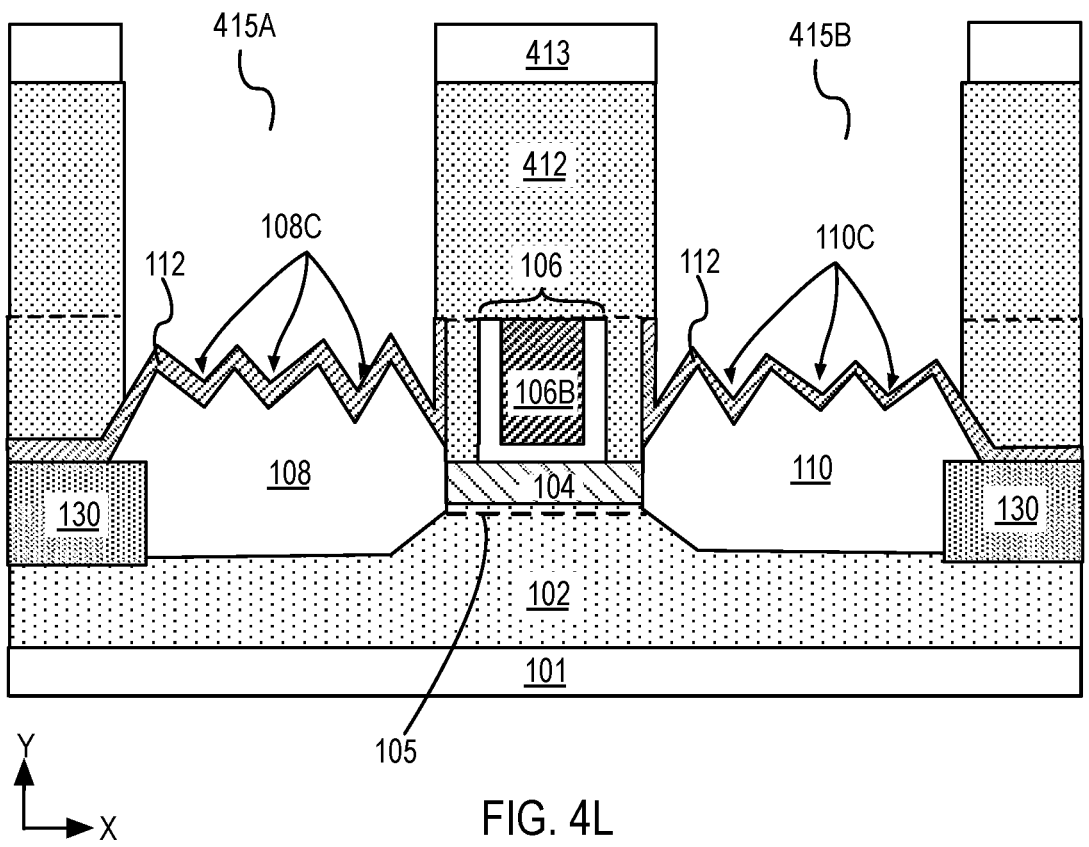
FIG. 4L illustrates the structure of FIG. 4K following the formation of source and drain contact openings, respectively above the source structure and drain structure, respectively, in accordance with embodiments of the present disclosure.
Figure 4M:
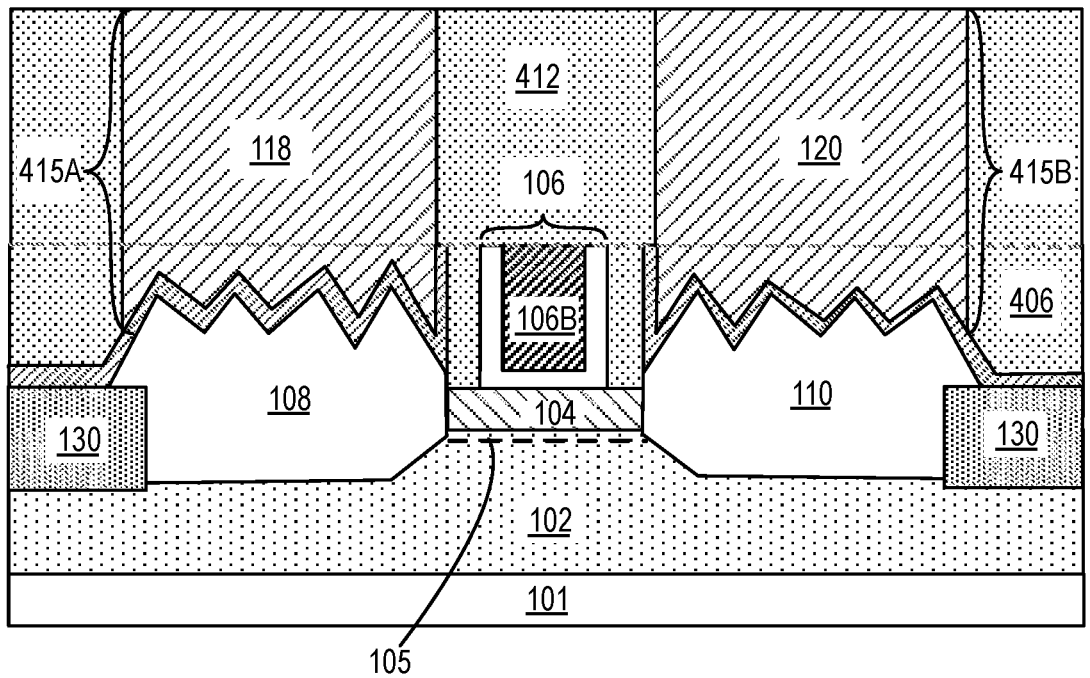
FIG. 4M illustrates the structure of FIG. 4L following the formation of an interconnect metallization in the source contact opening, and the formation of an interconnect metallization in the drain contact opening.
Figure 4N:
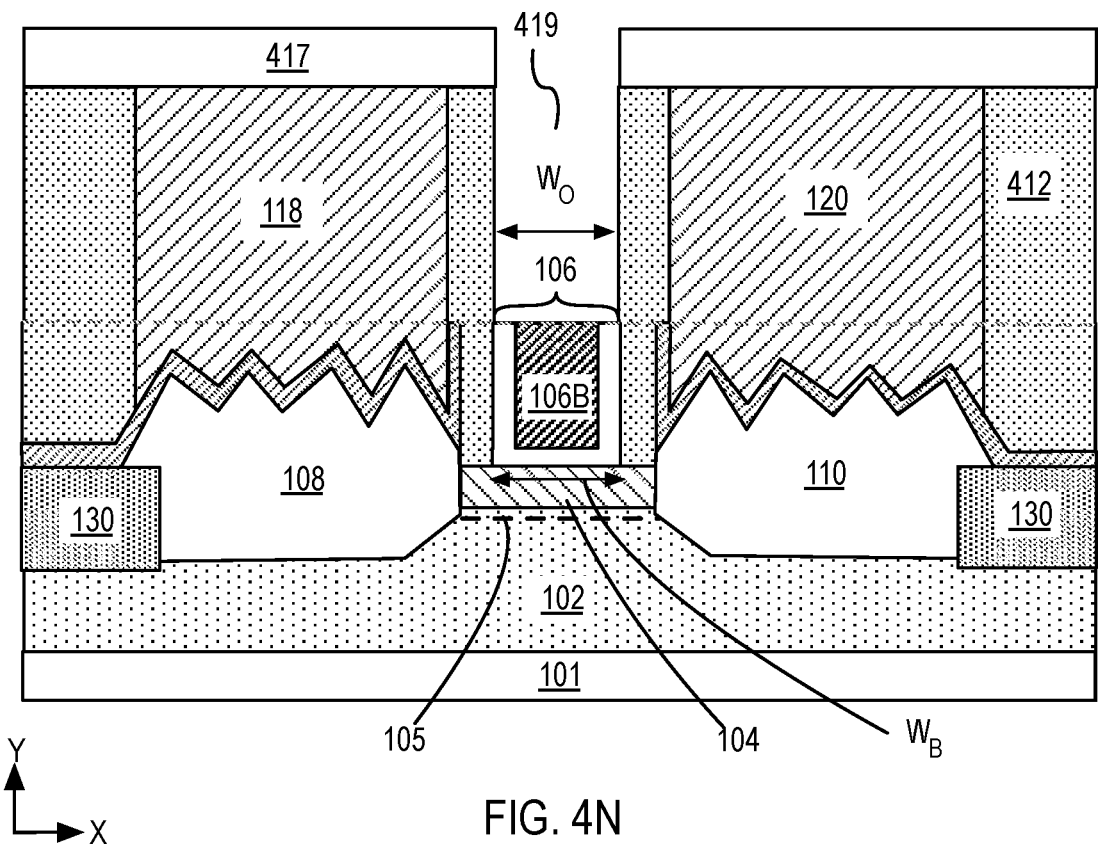
FIG. 4N illustrates the structure of FIG. 4L following the formation of a gate metallization opening.
Figure 4O:
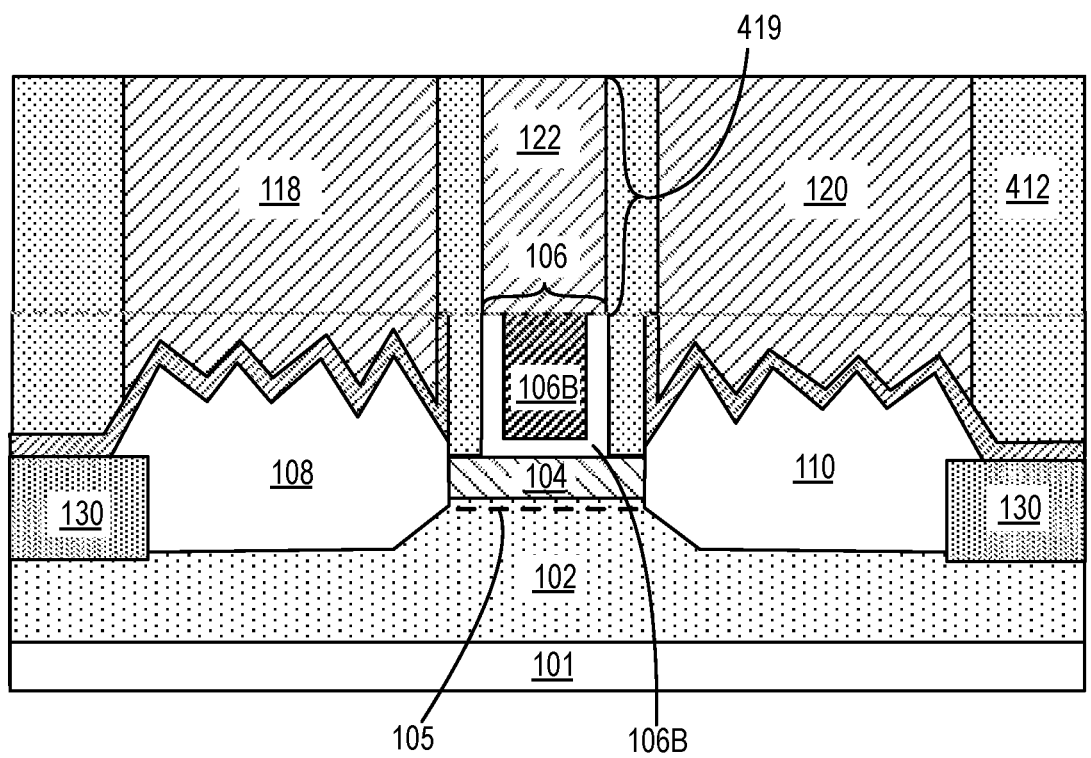
FIG. 4O illustrates the structure of FIG. 4N following the formation of a gate metallization.

FIGS. 4A-4O illustrate cross sectional views of the III-N transistor structure 100A illustrated in FIG. 1A evolving as a fabrication method, such as method 300, is practiced.

FIG. 4A illustrates a cross-sectional view of a patterned polarization layer 104 on a channel layer 102, in accordance with an embodiment of the present disclosure. In an embodiment, the channel layer 102 is grown above the substrate 101 by a metal organic chemical vapor deposition (MOCVD) process. In some embodiments, the MOCVD process is carried out at a temperature in the range of 1000-1100 degrees Celsius. In an embodiment, the channel layer 102 includes GaN. In an embodiment, the GaN channel layer 102 is grown to a thickness that is approximately in the range of 100 nm-5 micrometers. The channel layer 102 may have a defect density less than (1e10/cm2) when grown to a sufficient thickness, such as a thickness of at least 100 nm.

In an embodiment, the polarization layer 104 is formed on channel layer 102. The polarization layer 104 may be formed using a MOCVD process and grown immediately after the growth of the III-N material of the channel layer 102. In an embodiment, the polarization layer 104 is grown by a MOCVD process. In some embodiments, the MOCVD process is carried out at a temperature in the range of 1000-1100 degrees Celsius. Depending on the embodiment, the polarization layer 104 includes a material such as but not limited to AlN, AlInN or $Al_yGa_{1-y}N$ (where y is 0.24-0.36) and the III-N material includes a material such as but not limited to InGaN or GaN. The polarization layer 104 may be grown to a thickness between 3 nm and 20 nm. In an exemplary embodiment, the polarization layer 104 is AlInN. A polarization layer 104 having a thickness between 3 nm and 10 nm may induce strain in an uppermost surface of the channel layer 102. The presence of sufficient strain in channel layer 102 induces 2DEG (represented by dashed lines 105) in the strained region.

In an embodiment, a mask (not shown) is formed on the polarization layer 104. In one embodiment, a plasma etch process is utilized to etch the polarization layer 104 and the channel layer 102 through an exposed area in the mask to form one or more openings 401. In the illustrative embodiment, there are two openings 401. The openings 401 may be sufficiently deep to provide isolation for source and drain trenches to be formed. In one embodiment, the openings 401 each have a depth between 75 nm and 200 nm.

FIG. 4B illustrates the structure of FIG. 4A, following the formation of isolation 130 in the opening 401. In the illustrative embodiment, the isolation 130 is formed on the channel layer 102 and adjacent to the polarization layer 104. In an embodiment, a dielectric material is blanket deposited in the opening and on the polarization layer 104. Examples of the dielectric material may include any material that has a sufficient dielectric strength to provide electrical isolation such as, but not to, limited silicon dioxide, silicon nitride, silicon oxynitride, carbon doped nitride and carbon doped oxide. The dielectric material is subsequently planarized, for example using a chemical mechanical polish process. In the illustrative embodiment, the CMP process forms isolation 130 having an uppermost surface 130C that is co-planar or substantially co-planar with an uppermost surface 104A of the polarization layer 104.

FIG. 4C illustrates the structure of FIG. 4B, following the formation of recess 403A and 403B in the polarization layer 104 and in the channel layer 102. In an embodiment, a mask 402 is formed on a portion of the polarization layer 104. In other embodiments, the mask 402 may also be formed over the isolation 130 (not illustrated). The mask 402 may include a material that can withstand high temperature processing such as a silicon oxide or a silicon nitride. A silicon oxide or a silicon nitride may be removed selectively with respect to the polarization layer 104 in a downstream operation. In an embodiment, a plasma etch process is utilized to etch unmasked portions of the polarization layer 104 and continued until a portion of the channel layer 102 is etched to form trenches 403A and 403B. The trenches 403A and 403B have a depth, $H_R$, that is measured with respect to the polarization layer surface 104A. In an embodiment, $H_R$, is between 30 nm and 100 nm. In an embodiment, the patterned channel layer 102, has sloped sidewalls 102D and approximately flat lowermost surfaces 102E. The sloped sidewalls 102D may be defined by a linear facet or have a profile that has a compound slope (not depicted). FIG. 4D illustrates the structure of FIG. 4C, following the formation of a source structure 108 and drain structure 110 in the trenches 403A and 403B respectively. The source structure 108 and drain structure 110 may formed independently, for example, by masking one of the trenches 403A or 403B. In the illustrative embodiment, the source structure 108 and the drain structure 110 are grown at the same time. In an embodiment, source structure 108 and drain structure 110, are epitaxially grown sufficiently thick to fill trenches 403A and 403B respectively. In an embodiment, the source structure 108 and drain structure 110 are grown using a metal organic chemical vapor deposition MOCVD process. In the illustrative embodiment, the source structure 108 and drain structure 110 grow above the uppermost surface 104A of the polarization layer 104 and extend laterally onto portions of the isolation portions 130A and 130B respectively. In one such embodiment, the source structure 108 and drain structure 110 are referred to as raised source structure 108 and raised drain structure 110 respectively.

In an embodiment, an epitaxial growth process is utilized where the source structure 108 and drain structure 110 include III-N materials such as In, Ga and N. In some exemplary embodiments, the III-N materials includes In, Ga and N, where the atomic percent of indium is between 10-15 of the III-N materials. A 10-15 atomic percent indium concentration results in the formation of a source structure 108 and drain structure 110 that is polycrystalline. In some such embodiments, the top surfaces 108A and 110A are formed to have an irregularly shaped recesses 108C and 110C, respectively. A sufficiently high indium content, such as an indium content above 10 atomic percent, also forms microstructures 108C and 110C with faceted sidewalls. In other embodiments, by limiting the indium content to less than 3 atomic percent of the III-N materials including In, Ga and N, the source structure 108 or the drain structure 110 is formed to have a profile where the top surfaces 108A and 110A are predominantly flat, as illustrated in FIG. 2A. In an embodiment, the raised source structure 108 and raised drain structure 110, grow to form sidewalls 108B and 110B, respectively, adjacent to the polarization layer 104 and the mask 402. The sidewalls 108B and 110B have a profile that is determined by sidewalls of the polarization layer 104 and the mask 402. For example, when the sidewall 402A of the mask 402 is vertical, the sidewall 108B is vertical and when the sidewall 402B is vertical, sidewall 110B is also vertical.

The source structure 108 and drain structure 110 may be doped for enhancing electrical conductivity. For example, the source structure 108 and drain structure 110 may include an n-type dopant. In an embodiment, the n-type dopants are introduced in-situ during the MOCVD growth process, where n-type dopant includes Si or Ge. In an embodiment, an n-type doped raised drain structure 110 and an n-type doped raised source structure 108 are epitaxially grown to a total thickness, $T_{SD}$, that is between 60 nm to 200 nm. In an embodiment, a combination of the thickness, $T_{SD}$, width, $W_{SD}$ of the raised source structure 108 and the n-type dopant density are chosen to achieve a contact resistance that is less than 200 ohms-micron. In an embodiment, a combination of the thickness, $T_{SD}$, width, $W_{SD}$ of the raised drain structure 110 and the n-type dopant density are chosen to achieve a contact resistance that is less than 200 ohms-micron.

FIG. 4E illustrates the structure of FIG. 4D, following the formation of a silicide 112 on the source structure 108, on the drain structure 110, on the hardmask 402, and on the isolation 130. In an embodiment, the silicide 112 is formed by depositing a layer of silicon and a second layer including at least one of titanium, aluminum or nickel and annealing the first and second layers to form an alloy. In another embodiment, silicon and a metal such as nickel, aluminum or titanium are co-sputter deposited and annealed to form an alloy. The anneal temperature may range between 500-700 degrees Celsius. The silicide may be deposited to a thickness between 5 nm and 10 nm. In an embodiment, the silicide 112 is deposited on the source structure 108 or the drain structure 110. In the illustrative embodiment, the silicide 112 is deposited on the source structure 108 and drain structure 110. Depending on a surface texture of the source structure 108 and the drain structure 110, the silicide 112 may not be conformal with the recesses 108C and 110C. In some embodiments, the silicide 112 is conformal with sidewalls 402A and 402B of the mask 402. In other embodiments, the silicide 112 portions 112C and 112D have a thickness that is less than a thickness of the silicide portions 112A or 112B, respectively. In some embodiments, a process of masking and double depositing may be carried out to obtain silicide portion 112A that has a thickness that is greater or less than a thickness of the silicide portion 112B. In some such embodiments, the source structure 108 or drain structure 110 may be masked preferentially and the process of silicide deposition is carried out for a second time.

In an embodiment, a silicide portion 112C that is adjacent to sidewall 402A has a profile that is substantially matched with the sidewall 402A. For example, as shown, the silicide portion 112C is substantially vertical. The silicide portion 112C has a height, that is approximately equal to a height, $H_M$, of the mask 402, as shown. The height, $H_M$, is measured relative to polarization surface 104A. In an embodiment, a silicide portion 112D that is adjacent to sidewall 402B has a profile that is substantially matched with the sidewall 402B. For example, as shown, the silicide portion 112D is substantially vertical. The silicide portion 112D has a height that is approximately equal to a height, $H_M$, of the mask 402, as shown.

FIG. 4F illustrates the structure of FIG. 4E, following the formation of a first dielectric material 406 on the silicide 112, and following the planarization of the first dielectric material 406 and the silicide 112 from a top surface 402C. In an embodiment, the dielectric material 406 includes a material that is the same or substantially the same as the dielectric material 124. The dielectric material 406 may be blanket deposited on the silicide 112. In an embodiment, the dielectric material 406 is subsequently planarized, for example using a chemical mechanical planarization (CMP) process. In an embodiment, the CMP process removes the dielectric material 406 from above the mask 402. In an embodiment, the polish process is continued until the silicide is removed from above the mask 402. In the illustrative embodiment, the silicide portions 112C and 112D remain on sidewalls 402A and 402B, respectively. The mask 402 may be sufficiently tall that the silicide portions 112C and 112D may be above the silicide portions 112A and 112B, respectively, as illustrated. The height, $H_M$, of the mask 402 remaining after planarization process may be determined by an amount needed for a subsequent planarization process during gate stack formation. In an embodiment, height, $H_M$, of the mask 402 remaining after the planarization process is determined by a thickness, $T_E$, of the source structure 108 or drain structure 110. Over planarizing to remove more material of the mask 402 may result in an undesirable consequence of removing silicide portions 112A and 112B from upper portions of the source structure 108 and drain structure 110, respectively.

FIG. 4G illustrates the structure of FIG. 4F, following the removal of the mask 402 selectively to the dielectric material 406 and to the silicide 112. Removal of the mask 402 creates an opening 407 and exposes the uppermost surface of the polarization layer 104. The polarization layer 104 has a width, $W_{POL}$, between 70 nm and 1000 nm. A width, $W_{POL}$, between 70 nm and 1000 nm is sufficiently large enough to avoid large capacitance to develop between the silicide 112 and a gate stack that will be formed on a portion of the polarization layer 104, during III-N transistor operation.

FIG. 4H illustrates the structure of FIG. 4F, following the formation of a dielectric material 408 on the first dielectric material 406, on the silicide portions 112C and 112D, and on the exposed polarization layer surface 104A, followed by planarization of the dielectric material 408. In some examples, the dielectric material 408 is blanket deposited and includes a dielectric material 408 that is the same or substantially the same as the dielectric material 406. The planarization process may utilize, for example, a chemical mechanical polish (CMP) process. The CMP process also removes portions of the first dielectric material 406, and top portions of silicide portions 112C and 112D. After the CMP process the dielectric material 406 remains on the silicide 112 above the source structure 108 and drain structure 110.

FIG. 4I illustrates the structure of FIG. 4H, following the formation of a mask 409 and a gate opening 411 in the dielectric material 408 to expose a portion of the polarization layer 104. In an embodiment, the mask 409 is patterned over the dielectric material 408 and 406 and the silicide portions 112C and 112D. A pattern in the mask 409 defines a location for the gate opening 411 to be formed relative to the source structure 108 and drain structure 110. In one embodiment, a plasma etch process is utilized to form the gate opening 411 in the dielectric material 408, selectively to the underlying polarization layer 104 as illustrated in FIG. 4I. In an embodiment, gate opening 411 has a width, $W_B$, at the bottom of the opening 411 that is approximately between 20 nm and 500 nm as shown.

FIG. 4J illustrates the structure of FIG. 4I, following the formation of a gate structure 106 in the gate opening 411. Forming the gate structure 106 may include deposition of a metal on the polarization layer 104 in the gate opening 411. In the illustrative embodiment, formation of the gate structure 106 includes blanket depositing a gate dielectric layer 106A on a portion of the polarization layer 104 exposed by the gate opening 411, on the silicide portions 112C and 112D and on the dielectric material 408 and 406.

The gate dielectric layer 106A is also formed on sidewalls of the dielectric material 408 in the gate opening 411, as shown. In an embodiment, the gate dielectric layer 106A, is formed by an atomic layer deposition (ALD) process or a PVD process. A gate electrode layer 106B is then blanket deposited on the gate dielectric layer 106A in the gate opening 411. In an embodiment, the gate electrode layer 106B includes a layer of a work function metal deposited in the gate opening 411 on the gate dielectric layer 106A and a gate cap layer deposited on the work function metal. After deposition of the gate dielectric layer 106A and the gate electrode layer 106B, a planarization process is performed to remove the gate dielectric layer 106A from above dielectric materials 408, 406. The planarization process also removes the gate electrode layer 106B from surface of the dielectric materials 408, 406 and from above the silicide portions 112C and 112D. In an embodiment, the planarization process includes a chemical mechanical polish process, where the CMP process forms a gate 106 having an uppermost surface that is co-planar or substantially co-planar with the uppermost portions of the silicide portions 112C and 112D, dielectric material surface 406A and dielectric material surface 408A as shown in the cross-sectional illustration of FIG. 4J.

FIG. 4K illustrates the structure of FIG. 4J, following the deposition of a dielectric material 412 on the dielectric material surface 408A and 406A, on the gate 106 and on the silicide portions 112C and 112D. In an embodiment, the dielectric material 412 has a material composition that is the same or substantially the same as the material composition of the dielectric material 406 and is formed by deposition methods utilized to form the dielectric material 406.

FIG. 4L illustrates the structure of FIG. 4K following the formation of source contact and opening 415A and drain contact opening 415B, above the source structure 108 and drain structure 110, respectively. In an embodiment, a photoresist mask 413 is patterned on the dielectric material 412. In one embodiment, the photoresist mask 413 defines a location for the source contact opening 415A and drain contact opening 415B to be formed relative to the source structure 108 and the drain structure 110, respectively. In other embodiments, a single opening may be formed over the source structure 108 or the drain structure 110. In one embodiment, a plasma etch process is utilized to form the source contact opening 415A and drain contact opening 415B in the dielectric material 412 and 406. The plasma etch process may be selective to the silicide 112 on the source structure 108 and on the drain structure 110. In an embodiment, due to the presence of recesses 108C and 110C, the plasma etch process may be extended until the dielectric material 406 is removed from the recesses 108C and 110C. In an embodiment, a wet chemical etch may be utilized to perform a surface clean of the silicide 112 in the recesses 108C and 110C. Cleaning the surface clean of the silicide 112 may provide robust electrical contact between source structure 108 and a source contact (to be formed) and between the drain structure 110 and a drain contact (to be formed).

FIG. 4M illustrates the structure of FIG. 4L following the removal of the mask 413 and formation of a source contact 118 in the source contact opening 415A, and the formation of a drain contact 120 in the drain contact opening 415B. In an embodiment, the mask 413 is removed by a plasma ashing process which includes oxygen. In an embodiment, one or more layers of contact metal are deposited inside the source contact opening 415A and inside the drain contact opening 415B, on exposed surfaces of the silicide 112. For example, a liner material may be first deposited on the silicide 112, on sidewalls of the source contact opening 415A and drain contact opening 415B and on a top surface of the dielectric material 412. The liner material may include, for example, a metal such as ruthenium, titanium or tantalum or an alloy such as TiN or TaN. A fill metal such as tungsten, nickel, aluminum, copper, or cobalt may be blanket deposited on the liner material in the openings 415A and 415B. The liner material and the fill metal may be deposited by a PVD, PECVD or an ALD process. In an embodiment, the liner material is deposited to a thickness between 5 nm and 10 nm, and the fill metal is deposited to fill the remaining portion of each of the source contact opening 415A and the drain contact opening 415B. In other embodiments, the source contact 118 and the drain contact 120 includes only the fill metal.

A planarization process may be carried out to remove the liner material and the fill metal from the top surface of the dielectric material 412. In one embodiment, the planarization process includes a chemical mechanical polish (CMP) process. The CMP process leaves the liner material and the fill metal to form the source contact 118 and the drain contact 120 as shown in the cross-sectional illustration of FIG. 4M.

FIG. 4N illustrates the structure of FIG. 4L following the formation of a mask 417 and a gate contact opening 419 through the mask 417. In an embodiment, the mask 417 includes a photoresist material that is patterned over the dielectric material 412, the source contact 118 and the drain contact 120. In an embodiment, the mask 417 defines a location for a gate contact opening 419. In one embodiment, a plasma etch process is utilized to form the gate contact opening 419 in the dielectric material 412 and expose the gate 106. In the illustrative embodiment, gate opening 419 exposes the gate dielectric layer 106A and the gate electrode 106B. As shown, the gate opening 419 has a width, Wo that is substantially similar to the gate opening $W_B$.

The gate contact opening 419 has a width, Wo that is not substantially greater than $W_B$, to prevent shorting between a gate contact that will be subsequently formed and the source contact 118 and/or drain contact 120.

FIG. 4O illustrates the structure of FIG. 4N following the removal of the mask 417 and formation of a gate contact 122 in the gate contact opening 419. In an embodiment, formation of the gate contact 122 includes utilizing materials and methods, utilized to form source contact 118 and drain contact 120. A planarization process may be utilized to remove overburden from top surfaces of the source contact 118, drain contact 120 and the dielectric material 412. The planarization process forms a gate contact 120 that is sufficiently separated from the source contact 118 and gate contact 120, to prevent electrical shorting.

In some embodiments, materials of the silicide may be deposited and annealed after the formation of a gate structure resulting in transistors depicted in FIGS. 1B and 2D. FIGS. 5A-5F illustrate a method of fabricating a III-N transistor where a silicide is formed on a source structure 108 and on a drain structure 110 after the formation of a gate structure 106.

Figure 5A:
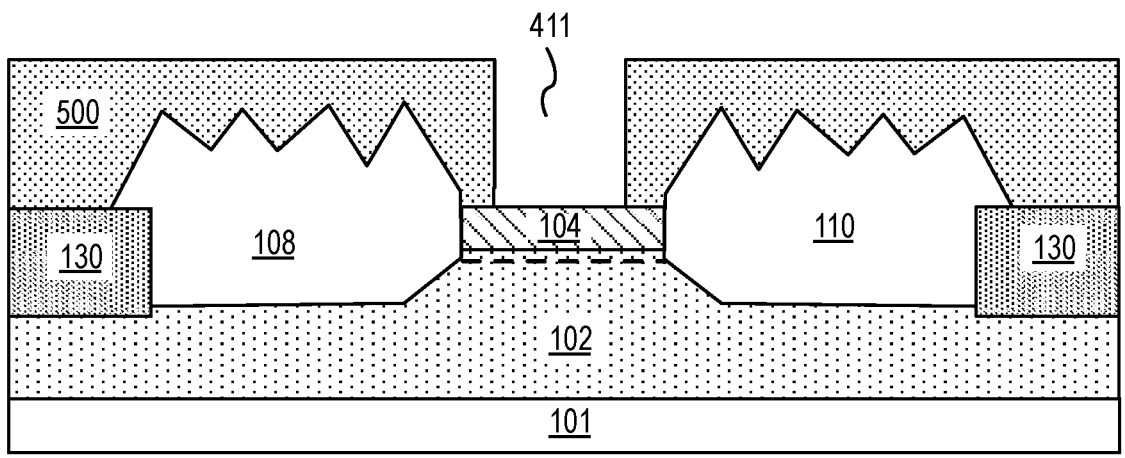
FIG. 5A illustrates the structure of FIG. 4D following the formation of a first dielectric material on the source structure, on the drain structure and on the mask.

FIG. 5A illustrates the structure of FIG. 4D following the formation of a dielectric material 500 on the source structure 108, on the drain structure 110 and on the mask 402, followed by planarization of the dielectric material 500 and then removal of the mask 402. In an embodiment, the dielectric material 500 has a material composition that is the same or substantially the same as the material composition of the dielectric material 406. In an embodiment, the planarization process that is utilized to planarize the dielectric material 500 also removes a top portion of mask 402. A remaining portion of mask 402, not removed by the planarization process may be removed, selectively to the polarization layer 104, by using a wet chemical etch process.

Figure 5B:
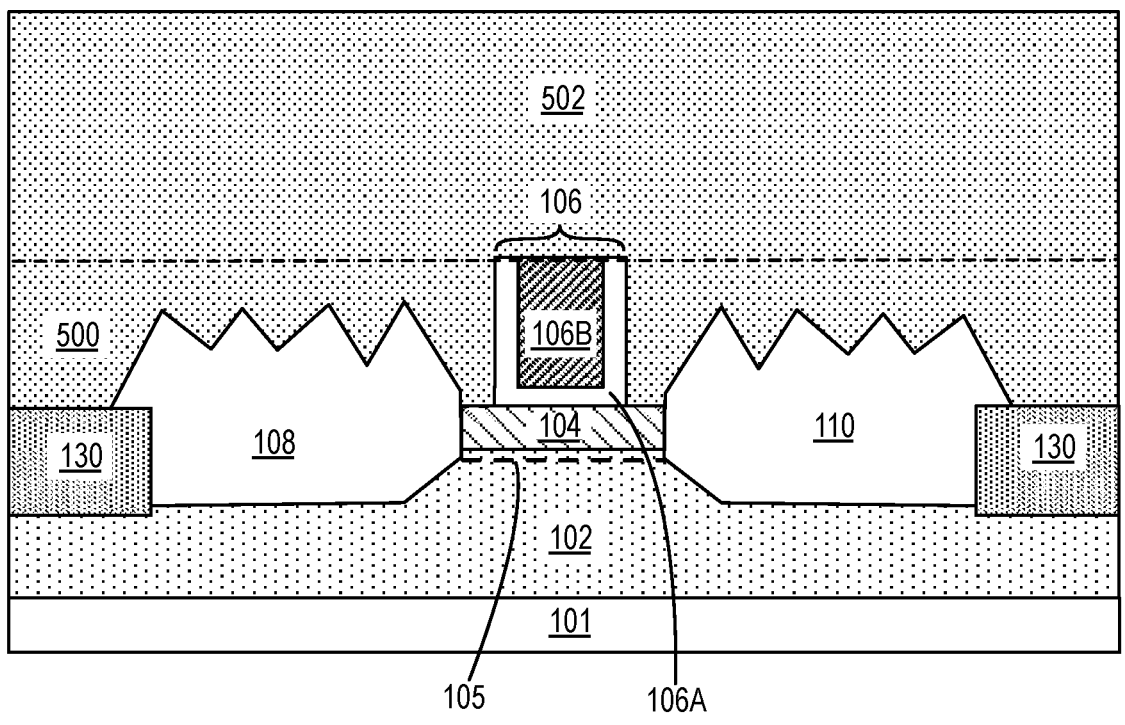
FIG. 5B illustrates the structure of FIG. 5A following the formation of a gate in the opening

FIG. 5B illustrates the structure of FIG. 5A following the formation of a gate structure 106 on the polarization layer 104 followed by a deposition of a dielectric material 502 on the gate structure 106 and on the dielectric material 500. In an embodiment, the gate structure is formed by utilizing methods similar to methods described in association with FIGS. 4I-4J. In an embodiment, the dielectric material 502 has a material composition that is the same or substantially the same as the material composition of the dielectric material 500.

Figure 5C:
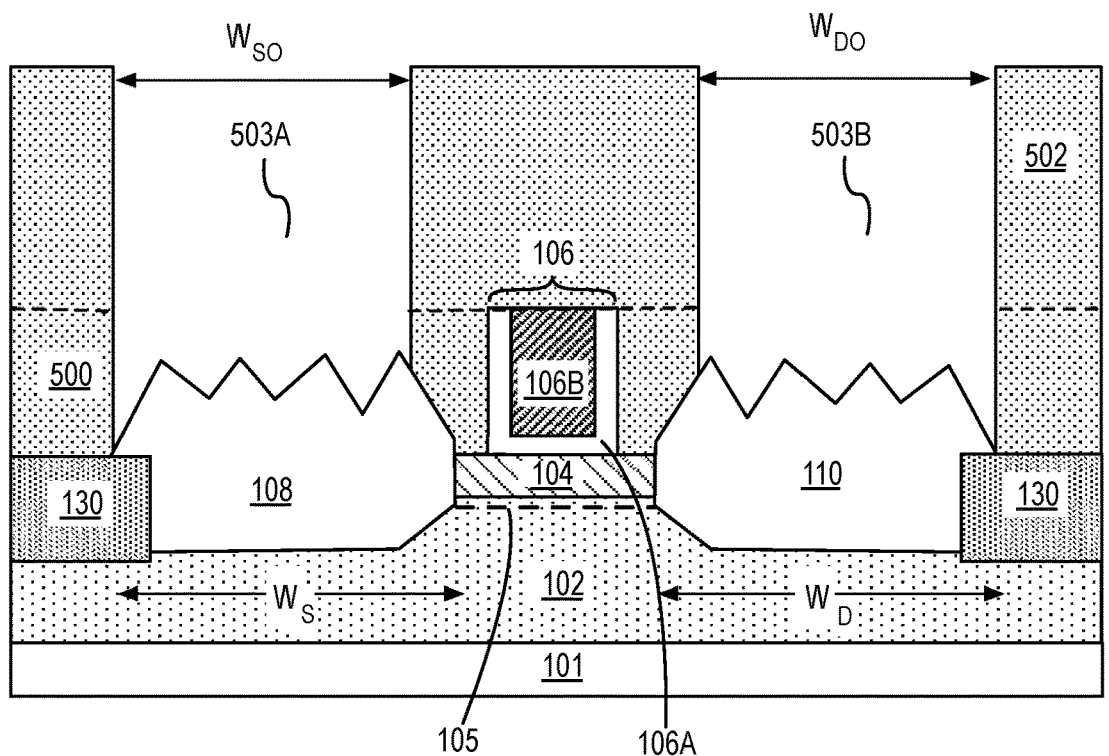
FIG. 5C illustrates the structure of FIG. 5B following the formation of a first opening and a second opening in the dielectric material to expose the source structure and the drain structure, respectively.

FIG. 5C illustrates the structure of FIG. 5B following the formation of a source contact opening 503A and drain contact opening 503B in the dielectric material 502 to expose the source structure 108 and the drain structure 110, respectively. A mask (not shown) may be formed on the dielectric material 502 to define locations where the source contact opening 503A and drain contact opening 503B are to be formed. In an embodiment, the source contact opening 503A has a width, $W_{SO}$, that is less than a width, $W_S$ of the source structure 108. In an embodiment, the drain contact opening 503A has a width, $W_{DO}$, that is less than a width, $W_D$ of the drain structure 110.

As discussed above, a large opening that exposes all top and sidewall surfaces of the source structure 108 and drain structure 110 may help to reduce electrical resistance. In some examples, $W_{DO}$ may be equal to or larger than $W_D$, however the opening 503B formed should not expose the polarization layer 104. $W_{SO}$ may be equal to or larger than $W_S$, however the opening 503A formed should not expose the polarization layer 104.

Figure 5D:
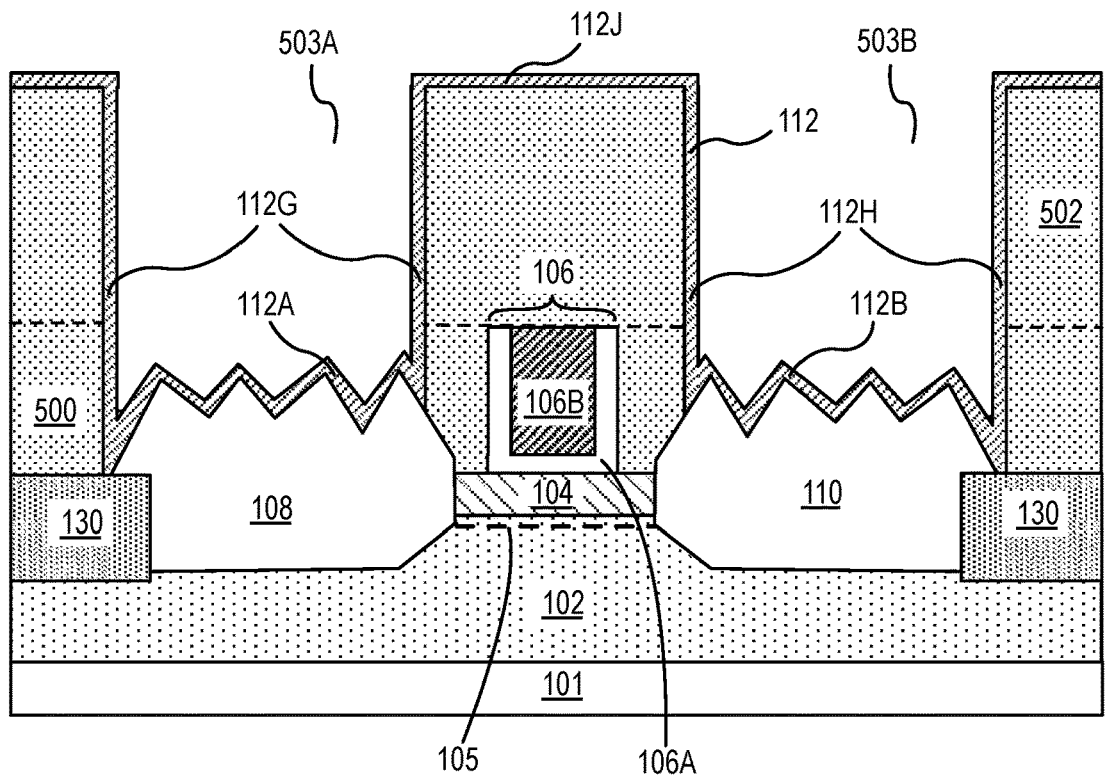
FIG. 5D illustrates the structure of FIG. 5C following the formation of a silicide in the first and second openings

FIG. 5D illustrates the structure of FIG. 5C following the formation of a silicide 112 in the source contact opening 503A, on the source structure 108 in the drain contact opening 503B, on the drain structure 110. When the silicide 112 is blanket deposited, a portion 112J is deposited on the dielectric material 502 and portions 112G and 112H are deposited on sidewalls of the dielectric material 500 and 502. In an embodiment, the silicide 112 may be formed at lower temperature than a temperature required to form the gate to prevent degradation of the gate electrode 106B. A silicide including a mixture of aluminum and oxygen (for e.g., $Al_2O_3$) may deposited at temperatures lower than a temperature utilized to deposit the gate electrode 106B.

Figure 5E:
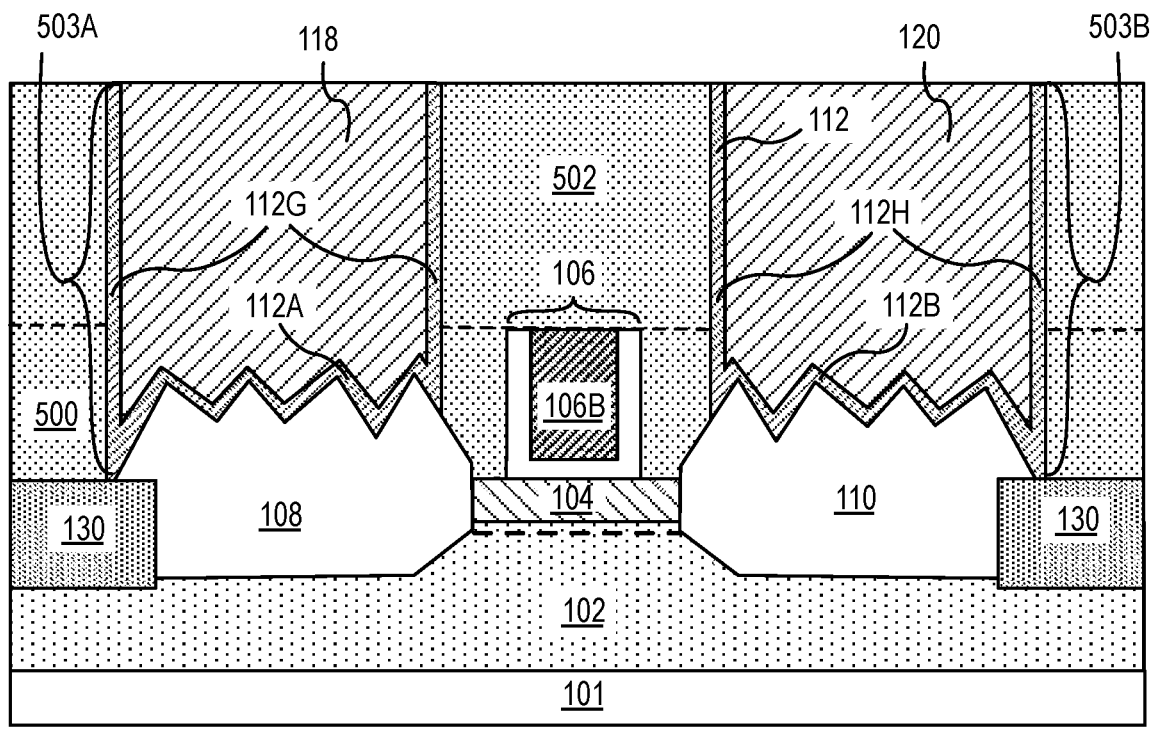
FIG. 5E illustrates the structure of FIG. 5D following the formation of a first metallization structure in the first opening and a second metallization structure in the second openings

FIG. 5E illustrates the structure of FIG. 5D following the formation of a source contact 118 in the source contact opening 503A and a drain contact 120 in the drain contact opening 503B. In an embodiment, one or more layers of contact metal are deposited inside the source contact opening 503A and inside the drain contact opening 503B on the silicide 112. For example, a liner material may be deposited on the silicide portions 112A and 112G in the source contact opening 503A and on silicide portions 112A and 112H in the drain contact opening 503B. The liner material may include, for example, a metal such as ruthenium, titanium or tantalum or an alloy such as TiN or TaN. A fill metal such as tungsten, nickel, aluminum, copper, or cobalt may be blanket deposited on the liner material in the openings 503A and 503B. The liner material and the fill metal may be deposited by a PVD, PECVD or an ALD process. In an embodiment, the liner material is deposited to a thickness between 5 nm and 10 nm, and the fill metal is deposited to fill the remaining portion of each of the source contact opening 503A and the drain contact opening 503B.

A planarization process may be performed to remove any liner and fill metal overburden from the top surface of the dielectric material 412. In one embodiment, the planarization process includes a chemical mechanical polish (CMP) process. The CMP process leaves the liner material and the fill metal in the source contact opening 503A to form the source contact 118, as shown in the cross-sectional illustration of FIG. 5E. The CMP process leaves the liner material and the fill metal in the drain contact opening 503B to form the drain contact 120, as shown.

In other embodiments, the source contact 118 and the drain contact 120 only include a fill metal.

Figure 5F:
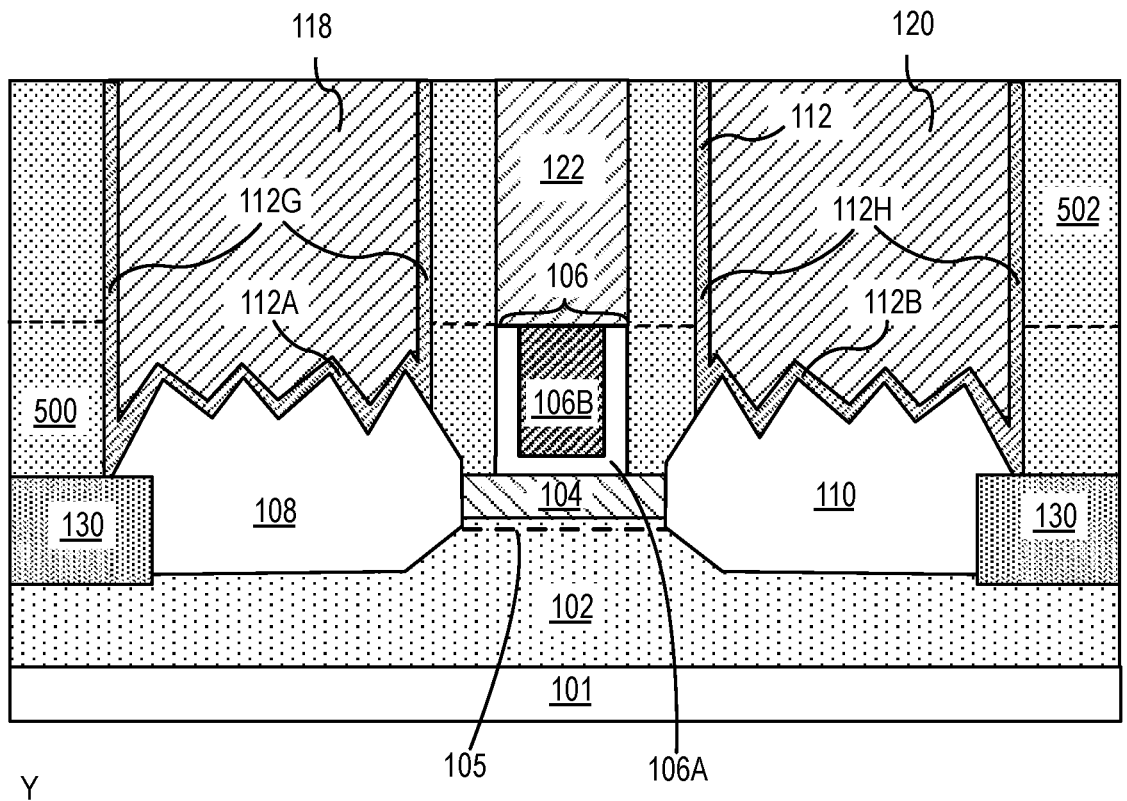
FIG. 5F illustrates the structure of FIG. 5E, following the formation of a gate metallization structure on the gate structure.

FIG. 5F illustrates the structure of FIG. 5E, following the formation of a gate contact structure 122 on the gate structure 106. In an embodiment, the methods and material utilized to form the gate contact structure 122 are substantially similar to the methods and material utilized to form the gate contact structure 122 described in association with FIGS. 4N-4O. In the illustrative embodiment, a planarization process that is utilized to remove gate contact material from above the dielectric material 502 also removes portions of silicide portions 112A and 112G.

Figure 6:
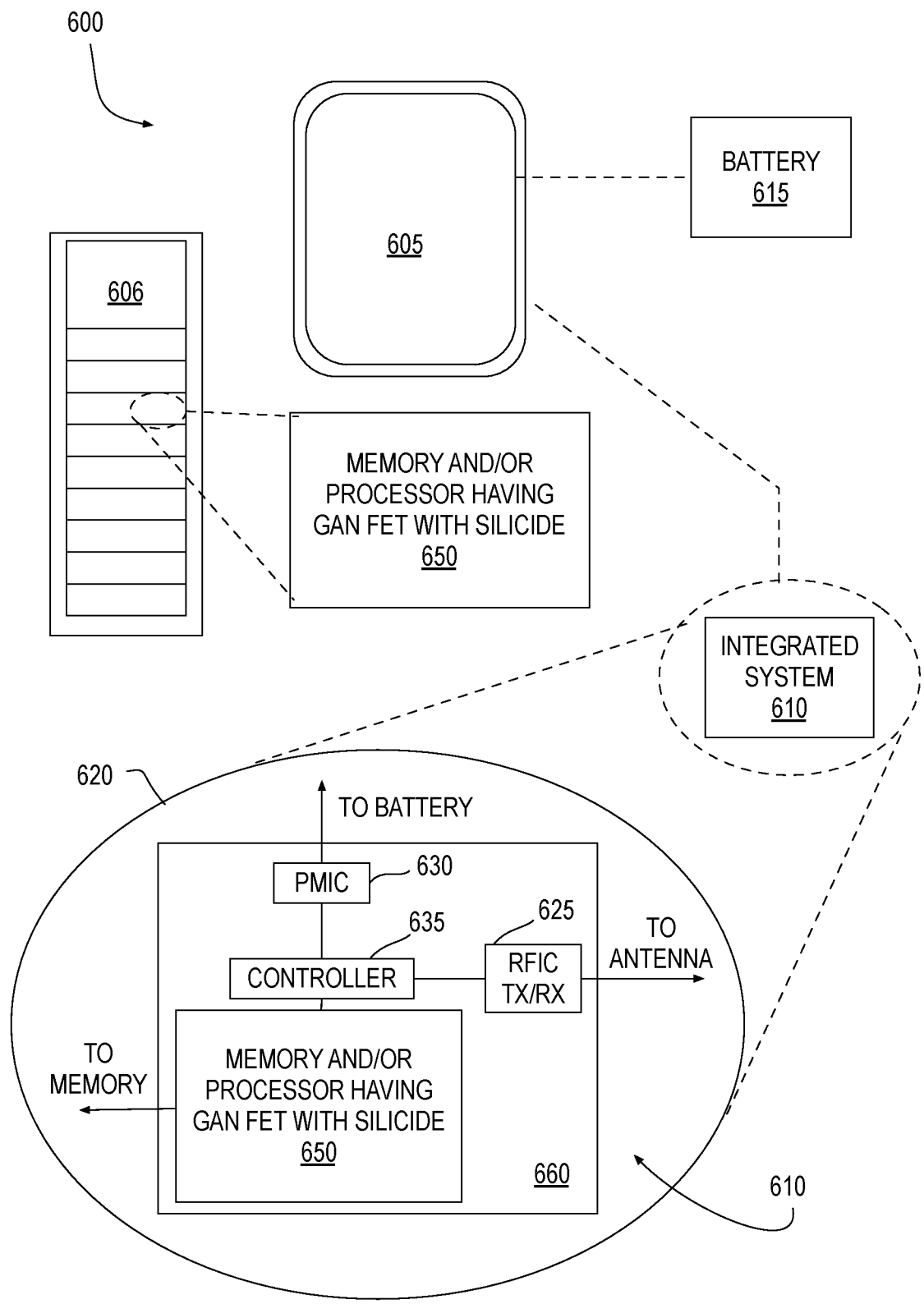
FIG. 6 is a functional block diagram of a III-N SoC including a III-N transistor of a mobile computing platform, in accordance with an embodiment of the present disclosure

FIG. 6 illustrates a system 600 in which a mobile computing platform 605 and/or a data server machine 606 employs an integrated circuit (IC) 650 including a device having a including a transistor such as transistor structure 100A, 100B, 100C, 200A or 200B, as described above. The server machine 606 may be any commercial server, for example including any number of high-performance computing platforms disposed within a rack and networked together for electronic data processing, which in the exemplary embodiment includes a packaged monolithic IC 650. The mobile computing platform 605 may be any portable device configured for each of electronic data display, electronic data processing, wireless electronic data transmission, or the like. For example, the mobile computing platform 605 may be any of a tablet, a smart phone, laptop computer, etc., and may include a display screen (e.g., a capacitive, inductive, resistive, or optical touchscreen), a chip-level or package-level integrated system 610, and a battery 615.

Whether disposed within the integrated system 610 illustrated in the expanded view 620, or as a stand-alone packaged chip within the server machine 606, packaged monolithic IC 650 includes a memory chip (e.g., RAM), or a processor chip (e.g., a microprocessor, a multi-core microprocessor, graphics processor, or the like) including at least one device system including a transistor such as transistor structure 100A, 100B, 100C, 200A or 200B for example, as described above. The monolithic IC 650 may be further coupled to a board, a substrate, or an interposer 660 along with, one or more of a power management integrated circuit (PMIC) 630, RF (wireless) integrated circuit (RFIC) 625 including a wideband RF (wireless) transmitter and/or receiver (TX/RX) (e.g., including a digital baseband and an analog front-end module further comprises a power amplifier on a transmit path and a low noise amplifier on a receive path), and a controller 635 thereof.

Functionally, PMIC 630 may perform battery power regulation, DC-to-DC conversion, etc., and so has an input coupled to battery 615 and with an output providing a current supply to other functional modules. As further illustrated, in the exemplary embodiment, RFIC 625 has an output coupled to an antenna (not shown) to implement any of a number of wireless standards or protocols, including but not limited to Wi-Fi (IEEE 802.11 family), WiMAX (IEEE 802.12 family), IEEE 802.10, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. In alternative implementations, each of these board-level modules may be integrated onto separate ICs coupled to the package substrate of the monolithic IC 650 or within a single IC coupled to the package substrate of the monolithic IC 650.

Figure 7:
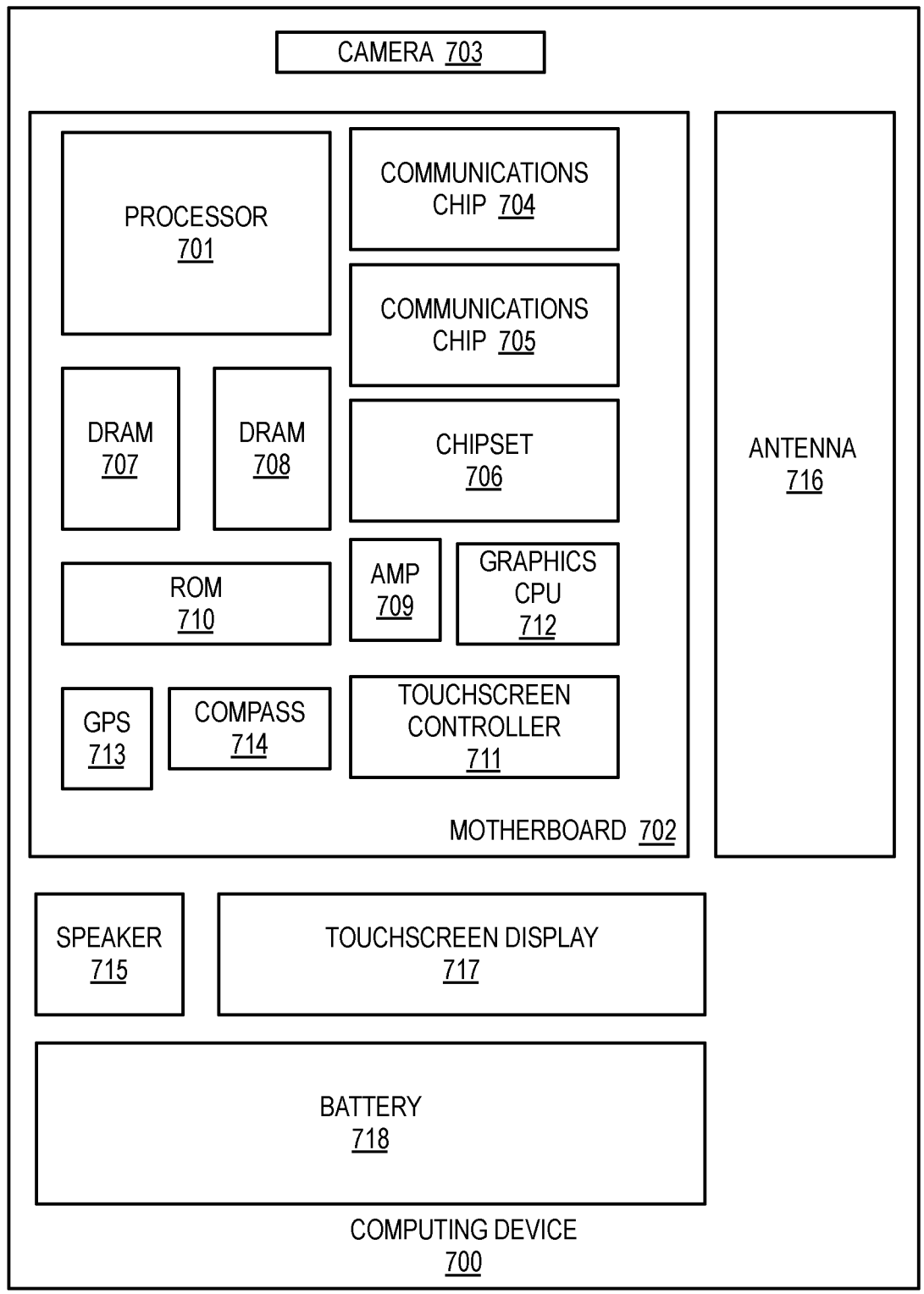
FIG. 7 illustrates a computing device in accordance with embodiments of the present disclosure

FIG. 7 illustrates a computing device 700 in accordance with embodiments of the present disclosure. As shown, computing device 700 houses a motherboard 702. Motherboard 702 may include a number of components, including but not limited to a processor 701 and at least one communications chip 705. Processor 701 is physically and electrically coupled to the motherboard 702. In some implementations, communications chip 705 is also physically and electrically coupled to motherboard 702. In further implementations, communications chip 705 is part of processor 701.

Depending on its applications, computing device 700 may include other components that may or may not be physically and electrically coupled to motherboard 702. These other components include, but are not limited to, volatile memory (e.g., DRAM), non-volatile memory (e.g., ROM), flash memory, a graphics processor, a digital signal processor, a crypto processor, a chipset 706, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

Communications chip 705 enables wireless communications for the transfer of data to and from computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communications chip 705 may implement any of a number of wireless standards or protocols, including but not limited to Wi-Fi (IEEE 802.11 family), WiMAX (IEEE 802.11 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 700 may include a plurality of communication chips 704 and 705. For instance, a first communications chip 705 may be dedicated to shorter range wireless communications such as Wi-Fi and Bluetooth and a second communications chip 704 may be dedicated to longer range wireless communications such as GPS, EDGE, GPRS, CDMA, WiMAX, LTE, Ev-DO, and others.

Processor 701 of the computing device 700 includes an integrated circuit die packaged within processor 701. In some embodiments, the integrated circuit die of processor 701 includes transistor such as transistor structure 100A, 100B, 100C, 200A or 200B, as described above. The term "processor" may refer to any device or portion of a device that processes electronic data from registers and/or memory to transform that electronic data into other electronic data that may be stored in registers and/or memory.

Communications chip 705 also includes an integrated circuit die packaged within communications chip 705. In another embodiment, the integrated circuit die of communications chip 705 includes a memory array with memory cells including a transistor such as transistor such as transistor structure 100A, 100B, 100C, 200A or 200B, as described above and a non-volatile memory device coupled to any of the transistors 100A, 100B, 100C, 200A or 200B. The non-volatile memory device may include a magnetic tunnel junction (MTJ) device, a resistive random-access memory (RRAM) device or a conductive bridge random access memory (CBRAM) device.

In various examples, one or more communication chips 704, 705 may also be physically and/or electrically coupled to the motherboard 702. In further implementations, communication chips 704 may be part of processor 701. Depending on its applications, computing device 700 may include other components that may or may not be physically and electrically coupled to motherboard 702. These other components may include, but are not limited to, volatile memory (e.g., DRAM) 707, 708, non-volatile memory (e.g., ROM) 710, a graphics CPU 712, flash memory, global positioning system (GPS) device 713, compass 714, a chipset 706, an antenna 716, a power amplifier 709, a touchscreen controller 711, a touchscreen display 717, a speaker 715, a camera 703, and a battery 718, as illustrated, and other components such as a digital signal processor, a crypto processor, an audio codec, a video codec, an accelerometer, a gyroscope, and a mass storage device (such as hard disk drive, solid state drive (SSD), compact disk (CD), digital versatile disk (DVD), and so forth), or the like. In further embodiments, any component housed within computing device 700 and discussed above may contain a stand-alone integrated circuit memory die that includes one or more arrays of memory cells and/or transistors such as transistor structure 100A, 100B, 100C, 200A or 200B, as described above and built in accordance with embodiments of the present disclosure.

In various implementations, the computing device 700 may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top b04, an entertainment control unit, a digital camera, a portable music player, or a digital video recorder. In further implementations, the computing device 700 may be any other electronic device that processes data.

Figure 8:
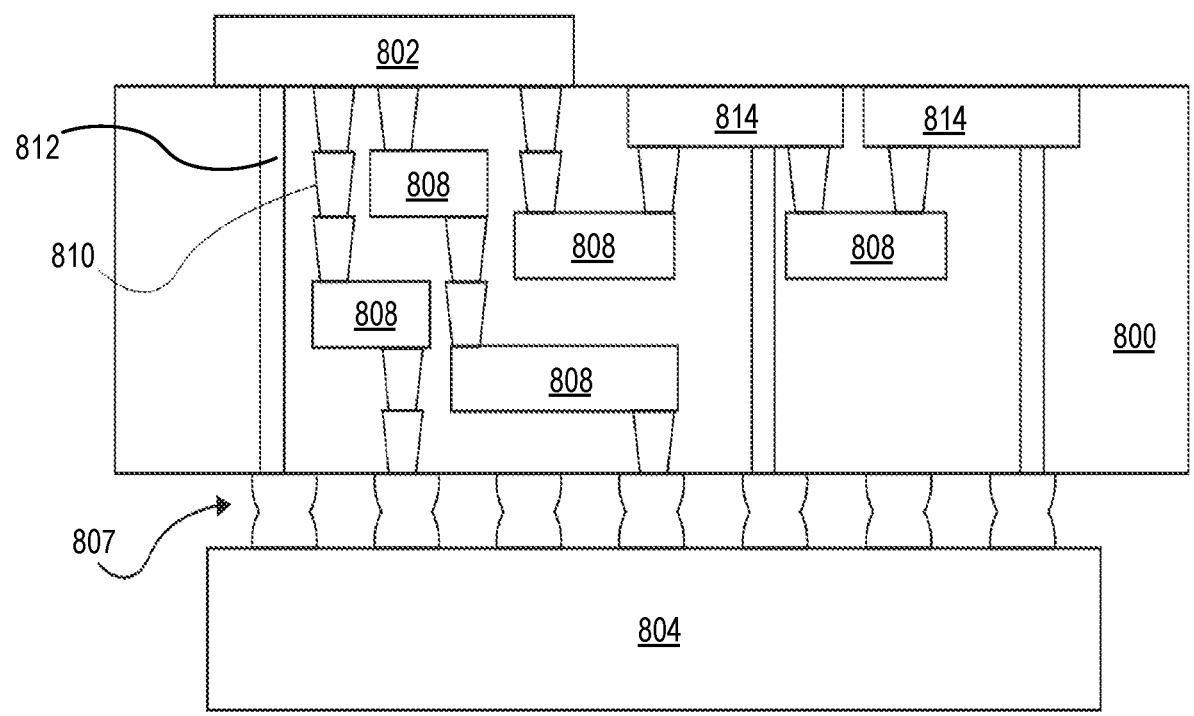
FIG. 8 illustrates an integrated circuit structure in accordance with embodiments of the present disclosure.

FIG. 8 illustrates an integrated circuit structure 800 that includes one or more embodiments of the disclosure. The integrated circuit (IC) structure 800 is an intervening structure used to bridge a first substrate 802 to a second substrate 804. The first substrate 802 may be, for instance, an integrated circuit die. The second substrate 804 may be, for instance, a memory module, a computer mother, or another integrated circuit die. The integrated circuit die may include one or more device systems including one or more transistors such as transistors 100A, 100B, 100C, 200A or 200B, as described above, for example. Generally, the purpose of an integrated circuit (IC) structure 800 is to spread a connection to a wider pitch or to reroute a connection to a different connection. For example, an integrated circuit (IC) structure 800 may couple an integrated circuit die to a ball grid array (BGA) 807 that can subsequently be coupled to the second substrate 804. In some embodiments, the first substrate 802 and second substrate 804 are attached to opposing sides of the integrated circuit (IC) structure 800. In other embodiments, the first substrate 802 and second substrate 804 are attached to the same side of the integrated circuit (IC) structure 800. And in further embodiments, three or more substrates are interconnected by way of the integrated circuit (IC) structure 800.

The integrated circuit (IC) structure 800 may be formed of an epoxy resin, a fiberglass-reinforced epoxy resin, a ceramic material, or a polymer material such as polyimide. In further implementations, the integrated circuit (IC) structure 800 may be formed of alternate rigid or flexible materials that may include the same materials described above for use in a semiconductor substrate, such as silicon, germanium, and other group III-N, group III-V and group IV materials The integrated circuit (IC) structure 800 may include metal interconnects 808 and via 810, including but not limited to through-silicon vias (TSVs) 812. The integrated circuit (IC) structure 800 may further include embedded devices 814, including both passive and active devices. Such devices include, but are not limited to, capacitors, decoupling capacitors, resistors, inductors, fuses, diodes, transformers, III-N transistor structures such as transistor structures 100A, 100B, 100C, 200A or 200B, as described above, one or more magnetic tunnel junction or resistive random-access devices, sensors, and electrostatic discharge (ESD) devices. More complex devices such as radio-frequency (RF) devices, power amplifiers, power management devices, antennas, arrays, sensors, and MEMS devices may also be formed on the integrated circuit (IC) structure 800. In accordance with embodiments of the present disclosure, apparatuses or processes disclosed herein may be used in the fabrication of integrated circuit (IC) structure 800.

As used in any implementation described herein, the term "module" refers to any combination of software, firmware and/or hardware configured to provide the functionality described herein. The software may be embodied as a software package, code and/or instruction set or instructions, and "hardware", as used in any implementation described herein, may include, for example, singly or in any combination, hardwired circuitry, programmable circuitry, state machine circuitry, and/or firmware that stores instructions executed by programmable circuitry. The modules may, collectively or individually, be embodied as circuitry that forms part of a larger system, for example, an integrated circuit (IC), system on-chip (SoC), and so forth.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

Thus, embodiments of the present disclosure include group III-Nitride (III-N) transistors and methods of fabrication.

In a first example, the device includes a first device layer including a group III-Nitride (III-N) material, a second device layer above the layer, where the second device layer includes a second III-N material, a gate electrode above the second device layer, a source structure and a drain structure on opposite sides of the gate electrode, where the source structure and a drain structure each include a third III-N material. The device further includes a silicide on at least a portion of the source structure or on a portion of the drain structure, and a contact coupled through the silicide to the source or the drain structure.

In second examples, for any of first examples, the silicide comprises silicon and at least one of titanium, nickel or aluminum and wherein the source structure and the drain structure includes indium and gallium.

In third examples, for any of the first through second examples, the silicide has a thickness between 4 nm and 15 nm and wherein the thickness varies between 2 nm and 5 nm.

In fourth examples, for any of the first through third examples, the silicide is on a top surface of the source structure or the drain structure.

In fifth examples, for any of the first through fourth examples, the silicide has a portion that extends upward from a level above the top surface of the source structure to a level of the top surface of the gate electrode, and a portion that extends upward from a level above the top surface of the drain structure to a level of the top surface of the gate electrode.

In sixth examples, for any of the first through fifth examples, the source structure and the drain structure have top surface portions that comprise recesses.

In seventh examples, for any of the first through sixth examples, the source structure and the drain structure have top surface that are predominantly planar.

In eighth examples, for any of the first through seventh examples, the third III-N material includes indium and gallium and wherein the indium content is between 10 and 15 atomic percent of the third III-N material and wherein the source structure and the drain structure is polycrystalline.

In ninth examples, for any of the first through fifth examples, the source structure and the drain structure include indium and gallium and wherein the source structure and the drain structure have top surfaces that are predominantly planar with recesses and wherein the indium content is between 1-3 atomic percent of the third III-N material.

In tenth examples, for any of the ninth examples, the recesses have hexagonal boundaries on the top surfaces and wherein the recesses have a depth, as measured from the top surface that is between 30-70% of a thickness of the source structure and the drain structure.

In eleventh examples, for any of the ninth through tenth examples, the source structure or the drain structure is single crystalline.

In twelfth examples, for any of the first through eleventh examples, the second III-N material has more aluminum than the first III-N material.

In thirteenth examples, for any of the first through twelfth examples, the silicide is on a sidewall of the source contact or the drain contact.

In a fourteenth example, for any of the first through thirteenth examples, the source structure has a thickness between 60 nm and 100 nm and the drain structure has a thickness between 60 nm and 100 nm, and wherein the device further includes a gate dielectric layer between the gate electrode and the second device layer.

In a fifteenth example, a method of fabricating a device includes forming a first device layer including a first III-Nitride (III-N) material above a substrate and forming a second device layer including a second III-N material above the first device layer. The method further includes forming a mask on the second device layer and etching a first recess and a second recess in the second device layer and in the first III-N material, where the first recess and the second recess is laterally separated by the mask. The method further includes forming a source structure in the first recess and a drain structure in the second recess and forming a silicide on at least one of the source structure or the drain structure. The method further includes forming an opening that exposes the second device layer by removing the mask, forming a gate stack over the second device layer and forming a contact coupled to the source structure or the drain structure through the silicide.

In sixteenth examples, for any of the fifteenth examples, forming the silicide includes depositing a layer of silicon and a second layer including at least one of titanium, aluminum or nickel and annealing the first and second layers to form an alloy.

In seventeenth examples, for any of the fifteenth through sixteenth examples, the method further includes forming a portion of the silicide on a top surface and on a sidewall of the mask, depositing a layer of dielectric material on the mask and on the silicide and leaving a portion of the silicide on the sidewall of the mask by planarizing and removing the dielectric material and silicide from the top surface of the mask.

In eighteenth examples, for any of the fifteenth through seventeenth examples, forming the silicide includes depositing a layer of dielectric material on the source structure, on the drain structure and on the mask, planarizing the dielectric material, forming a first opening and a second opening by etching the dielectric material, where the etching exposes the source structure and the drain structure. The method further includes forming the silicide in the first opening, on the source structure and on a sidewall of the dielectric material in the first opening, and forming the silicide in the second opening, on the drain structure and on a sidewall of the dielectric material in the second opening.

In nineteenth examples, for any of the fifteenth through eighteenth examples, system includes a processor and a radio transceiver coupled to the processor, where the transceiver includes a transistor. The transistor includes a layer including a first III-Nitride (III-N) material, a second device layer above the layer, where the second device layer includes a second III-N material, a gate electrode above the second device layer, a source structure and a drain structure on opposite sides of the gate electrode, where the source structure and a drain structure each include a third III-N material. The device further includes a silicide on at least a portion of the source structure and on at least a portion of the drain structure, a source contact coupled with the silicide on the source structure and a drain contact coupled with the silicide on the drain structure.

In a twentieth example, for any of the fifteenth through nineteenth examples, the silicide includes silicon and at least one of titanium, nickel or aluminum and wherein the source structure and the drain structure includes indium and gallium.

What is claimed is:

1. A transistor structure comprising:
   a gate electrode over a channel material, wherein the channel material comprises a Group III element and nitrogen;
   a source material and a drain material coupled to the channel material, wherein the source material or the drain material have a different composition than the channel material and also comprise a Group III element and nitrogen; and
   a contact metal coupled to at least one of the source material or the drain material through an intervening material layer comprising silicon and a metal, wherein the intervening material layer is in direct contact with the at least one of the source material or the drain material.

2. The transistor structure of claim 1, wherein the intervening material comprises at least one of titanium, nickel or aluminum.

3. The transistor structure of claim 1, wherein the intervening material has a thickness of at least 4 nm.

4. The transistor structure of claim 3, wherein the thickness varies by at least 2 nm.

5. The transistor structure of claim 4, wherein a top of the source material or the drain material comprises recesses having a depth of at least 5 nm as measured from a highest point on the top of the source material or the drain material.

6. The transistor structure of claim 1, wherein the contact metal comprises a first metal and the intervening material comprises a second metal, different than the first metal.

7. The transistor structure of claim 6, wherein the intervening material is on a sidewall of the contact metal.

8. The transistor structure of claim 5, wherein the intervening material comprises a first portion that extends upward from a level of the top of the source structure to a level of a top of the gate electrode, and a second portion that extends upward from a level of the top of the drain structure to a level of the top of the gate electrode.

9. The transistor structure of claim 1, wherein:
   the source material and the drain material comprise indium; and
   the channel material comprises gallium.

10. The transistor structure of claim 9, wherein indium content is between 10 and 15 atomic percent of the source material and drain material.

11. The transistor structure of claim 9, wherein the source material and the drain material comprise gallium.

12. The transistor structure of claim 1, wherein the channel material, source material and the drain material are substantially single crystalline.

13. A system comprising:
a processor; and
a radio transceiver coupled to the processor, wherein the radio transceiver includes a transistor comprising:
a channel material comprising a first alloy of gallium and nitrogen;
a source material and a drain material coupled to the channel material, wherein the source material and the drain material comprise a second alloy of gallium and nitrogen;
a contact metal coupled at least one of the source material or the drain material through an intervening material layer comprising silicon and a metal, wherein the intervening material layer is in direct contact with the second alloy of gallium and nitrogen.

14. The system of claim 13, further comprising a power supply coupled to at least one of the processor or the radio transceiver.

15. The system of claim 13, wherein the intervening material comprises at least one of titanium, nickel or aluminum and has a thickness of at least 4 nm.

16. The system of claim 13, wherein the channel material comprises Ga, and at least one of the source material and the drain material comprises In.

17. The system of claim 13, wherein the intervening material is in direct contact with the contact.

18. A transistor structure comprising:
a gate electrode over a channel material, wherein the channel material comprises a Group III element and nitrogen;
a source material and a drain material coupled to the channel material, wherein the source material or the drain material have a different composition than the channel material and also comprise a Group III element and nitrogen;
a first metal coupled to at least one of the source material or the drain material through an intervening material layer comprising silicon and a second metal different than the first metal; and
a third metal in direct contact with the first metal.

19. The transistor structure of claim 18, wherein the intervening material layer comprises titanium, aluminum or nickel.

20. The transistor structure of claim 19, wherein the second metal comprises ruthenium, titanium or tantalum and the third metal comprises tungsten, nickel, aluminum, copper, or cobalt.

* * * * *